United States Patent
Liu et al.

(10) Patent No.: US 7,824,998 B2
(45) Date of Patent: Nov. 2, 2010

(54) METHOD OF FORMING A SEMICONDUCTOR CAPACITOR USING AMORPHOUS CARBON

(75) Inventors: Yuan-Hung Liu, Hsin-Chu (TW); Ming Chyi Liu, Hsinchu (TW); Yeur-Luen Tu, Taichung (TW); Chi-Hsin Lo, Zhubei (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/357,661

(22) Filed: Jan. 22, 2009

(65) Prior Publication Data

US 2009/0130814 A1    May 21, 2009

Related U.S. Application Data

(62) Division of application No. 11/461,673, filed on Aug. 1, 2006, now abandoned.

(51) Int. Cl.
*H01L 21/20* (2006.01)

(52) U.S. Cl. .................. 438/397; 438/396; 438/398; 438/399; 438/254; 257/E21.008; 257/E21.014

(58) Field of Classification Search ............ 438/396, 438/397, 398, 399, 254; 257/E21.008, E21.014
See application file for complete search history.

(56) References Cited

U.S. PATENT DOCUMENTS

| 6,436,763 | B1 * | 8/2002 | Huang et al. ............ 438/255 |
| 2002/0057548 | A1 * | 5/2002 | Crenshaw et al. ........ 361/302 |
| 2004/0000534 | A1 | 1/2004 | Lipinski |
| 2004/0092098 | A1 | 5/2004 | Sudijono et al. |
| 2005/0085072 | A1 | 4/2005 | Kim et al. |
| 2005/0112883 | A1 | 5/2005 | Savas et al. |
| 2005/0167839 | A1 | 8/2005 | Wetzel et al. |
| 2005/0199013 | A1 | 9/2005 | Vandroux et al. |
| 2005/0239002 | A1 | 10/2005 | Li |
| 2006/0003544 | A1 | 1/2006 | Derderian et al. |
| 2006/0024945 | A1 | 2/2006 | Kim et al. |

* cited by examiner

*Primary Examiner*—Thanh V Pham
(74) *Attorney, Agent, or Firm*—Duane Morris LLP

(57) ABSTRACT

A method includes forming an amorphous carbon layer over a first dielectric layer formed over a substrate, forming a second dielectric layer over the amorphous carbon layer; and forming an opening within the amorphous carbon layer and second dielectric layer by a first etch process to partially expose a top surface of the first dielectric layer. A substantially conformal metal-containing layer is formed over the second dielectric layer and within the opening. The second dielectric layer and a portion of the metal-containing layer are removed. The amorphous carbon layer is removed by an oxygen-containing plasma process to expose a top surface of the first dielectric layer. An insulating layer is formed over the metal-containing layer, and a second metal-containing layer is formed over the insulating layer to form a capacitor.

5 Claims, 25 Drawing Sheets

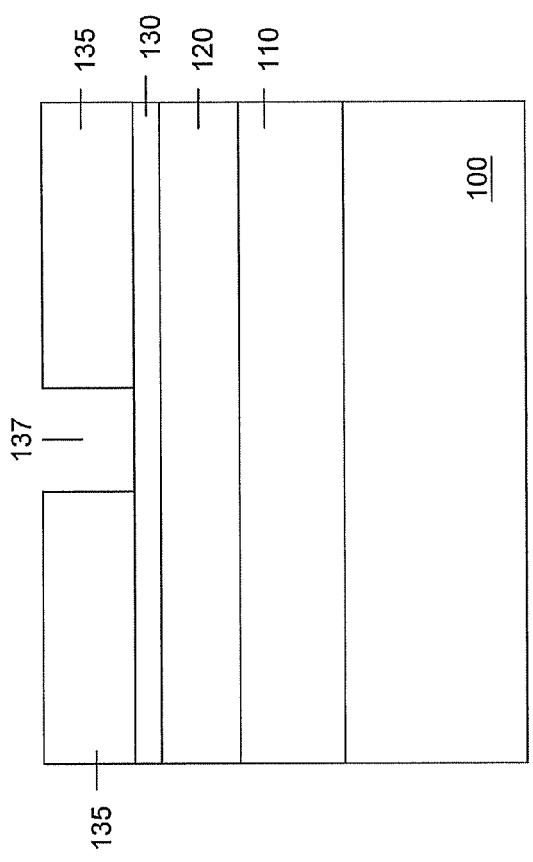
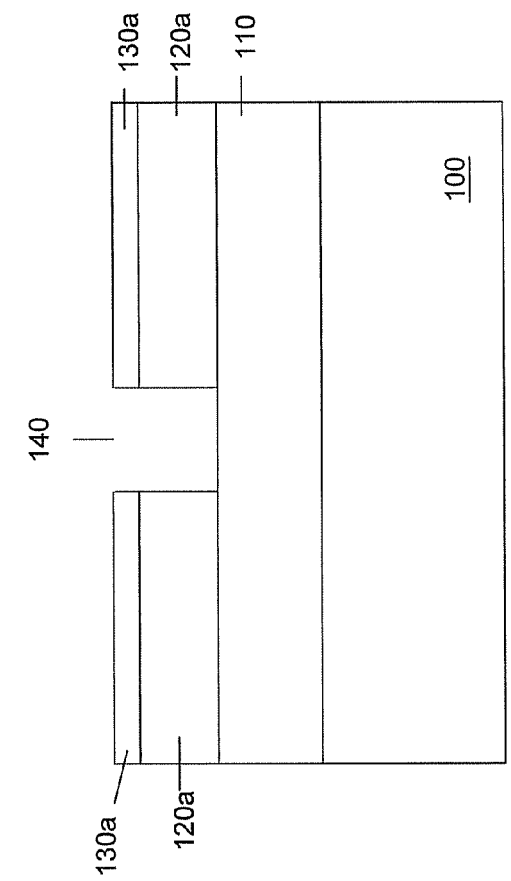

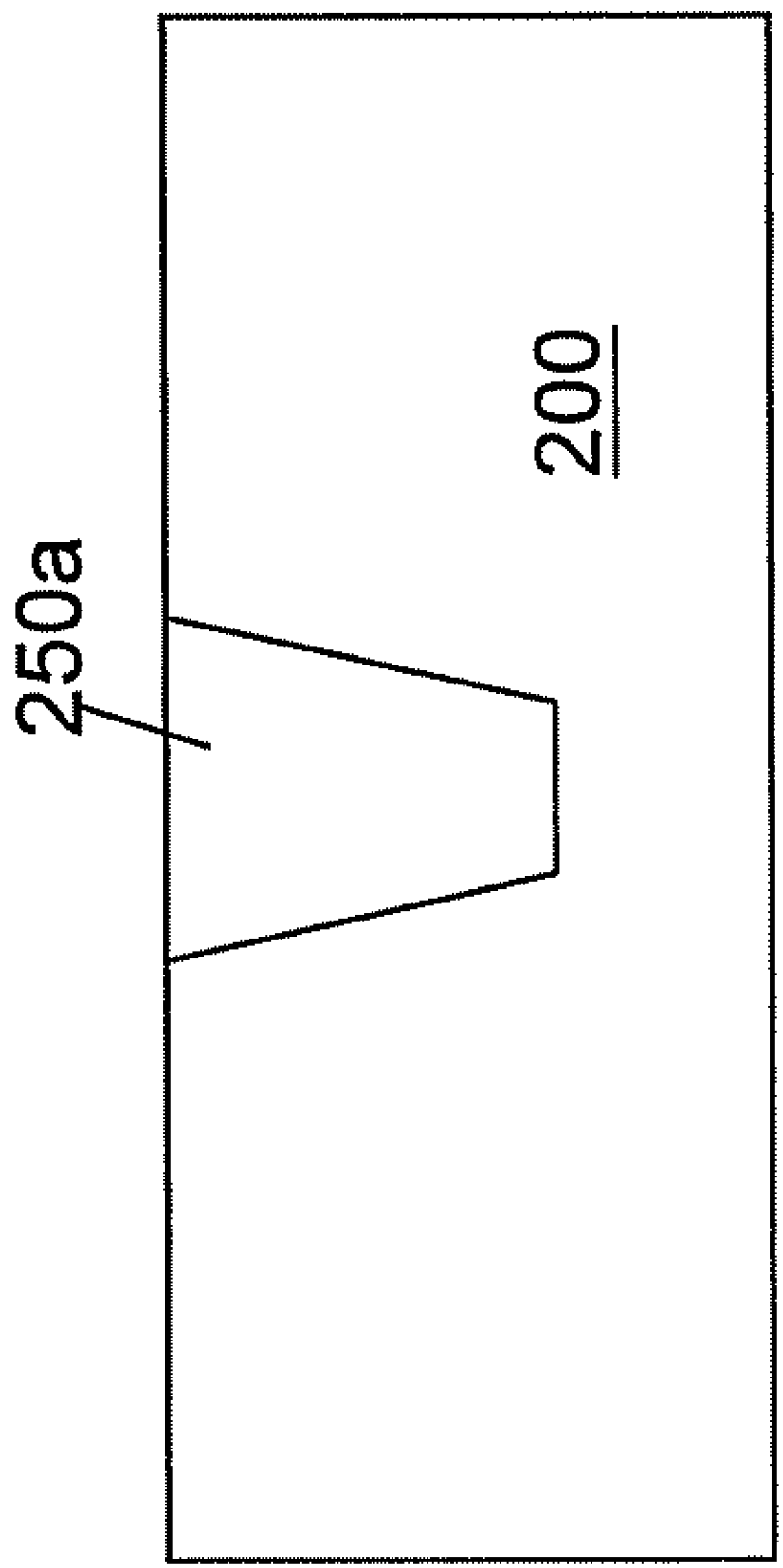

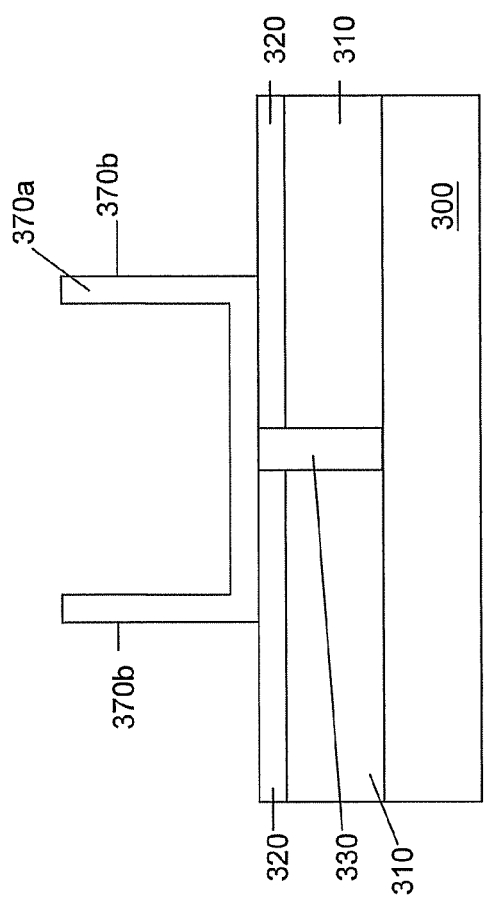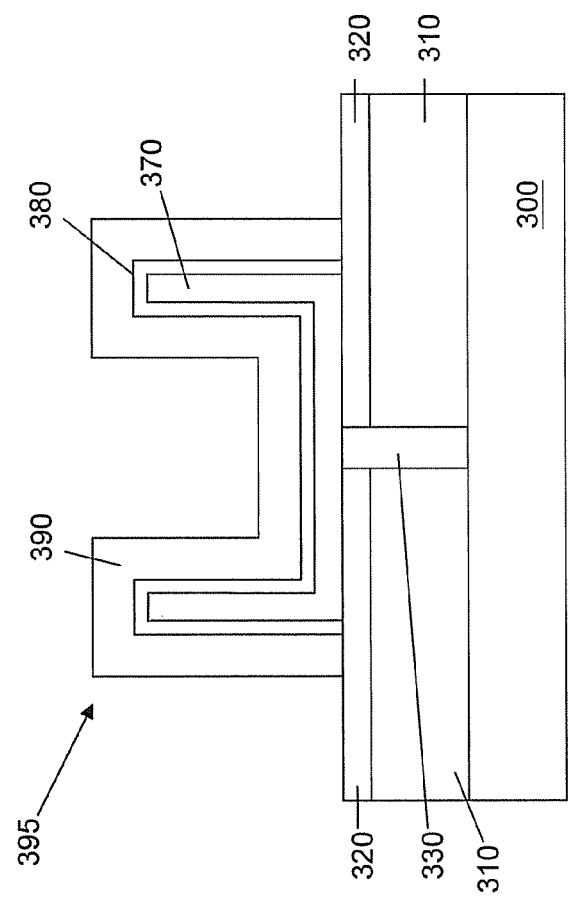

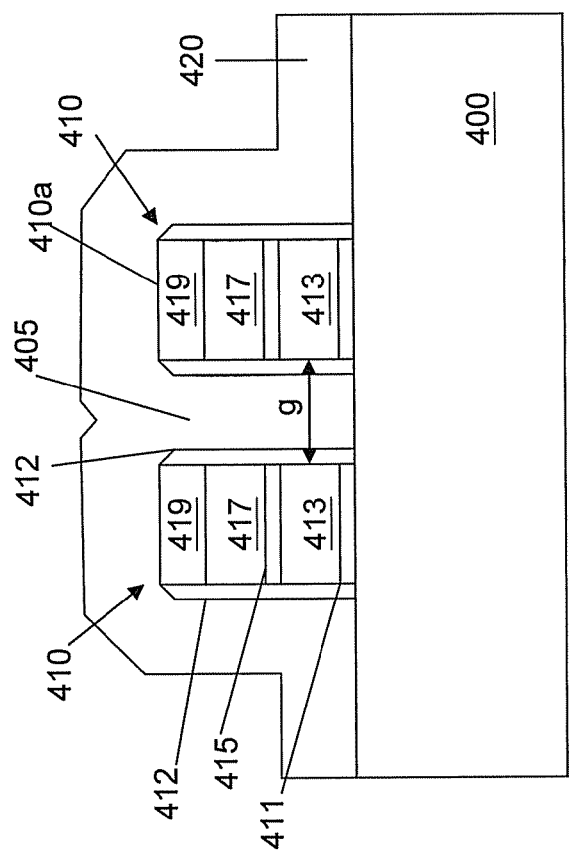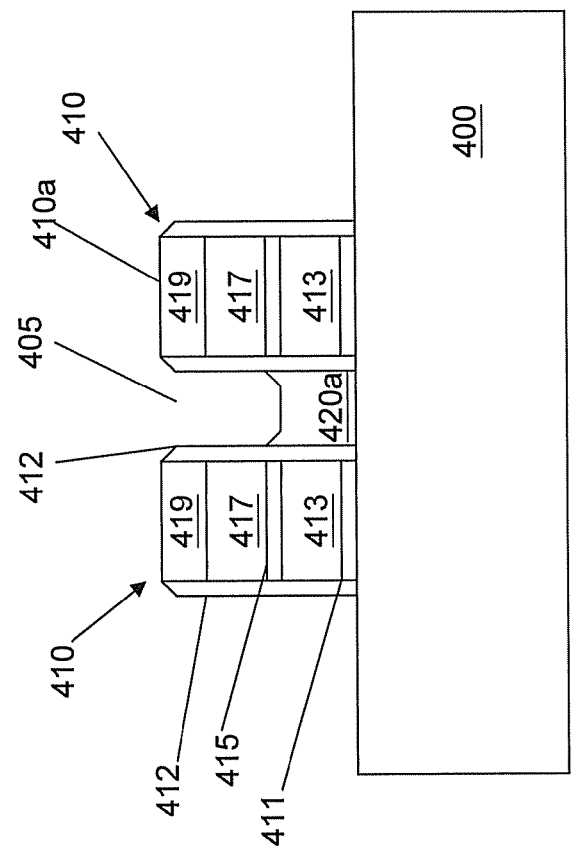

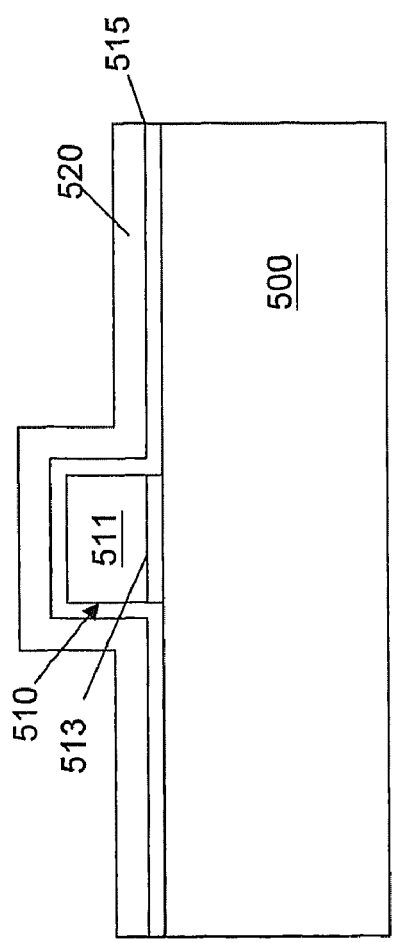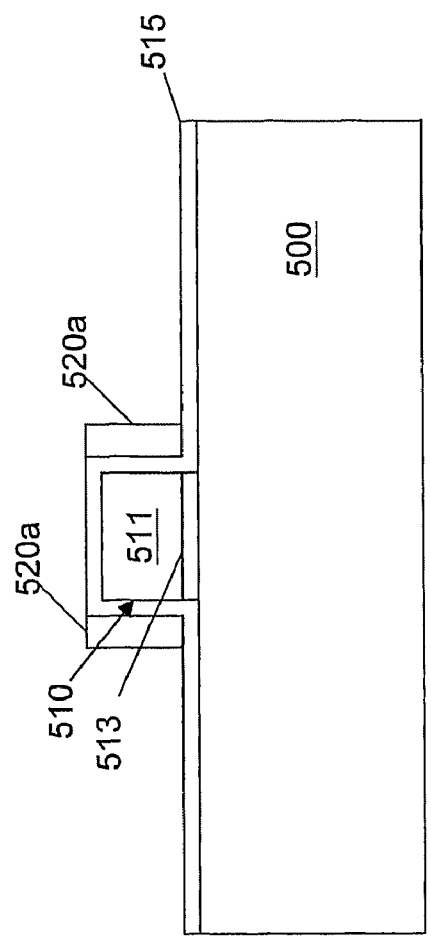

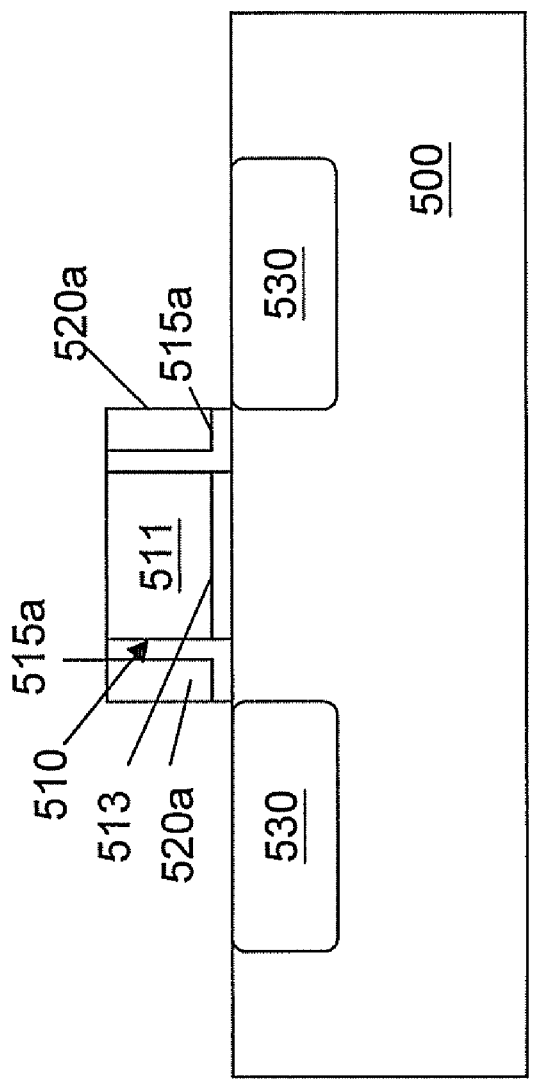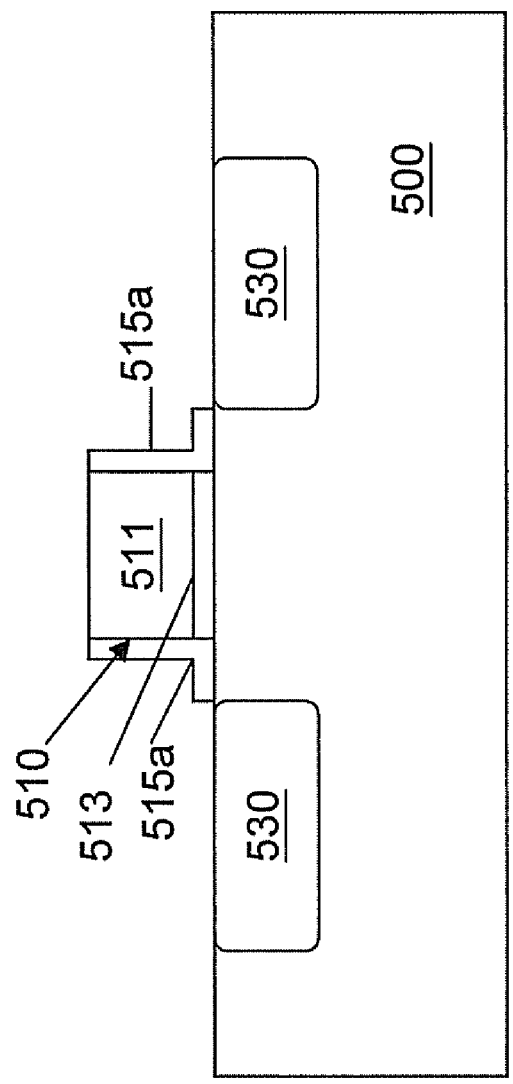

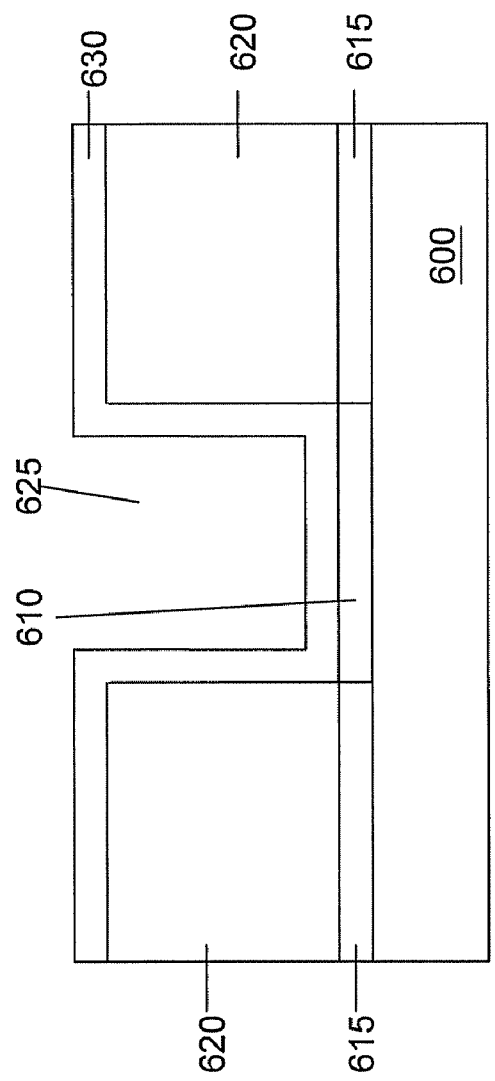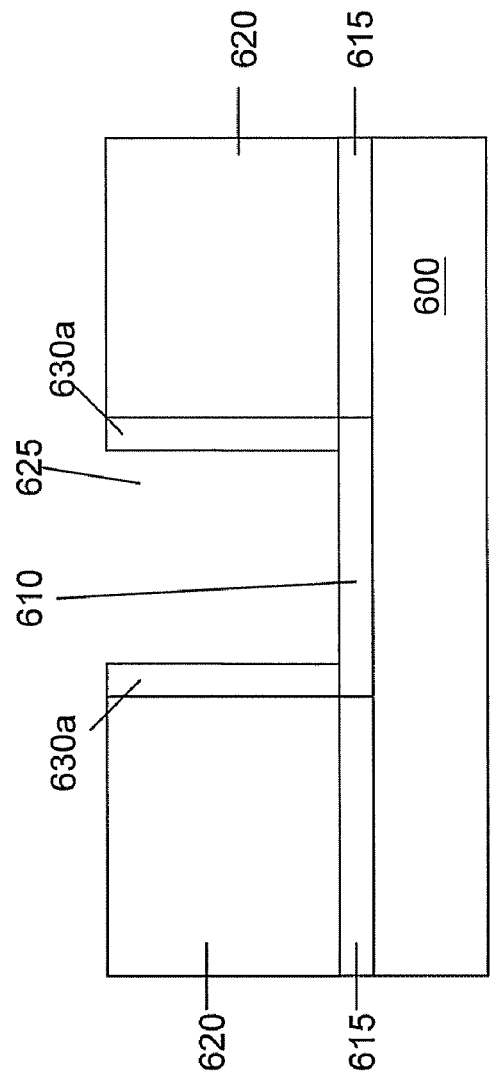

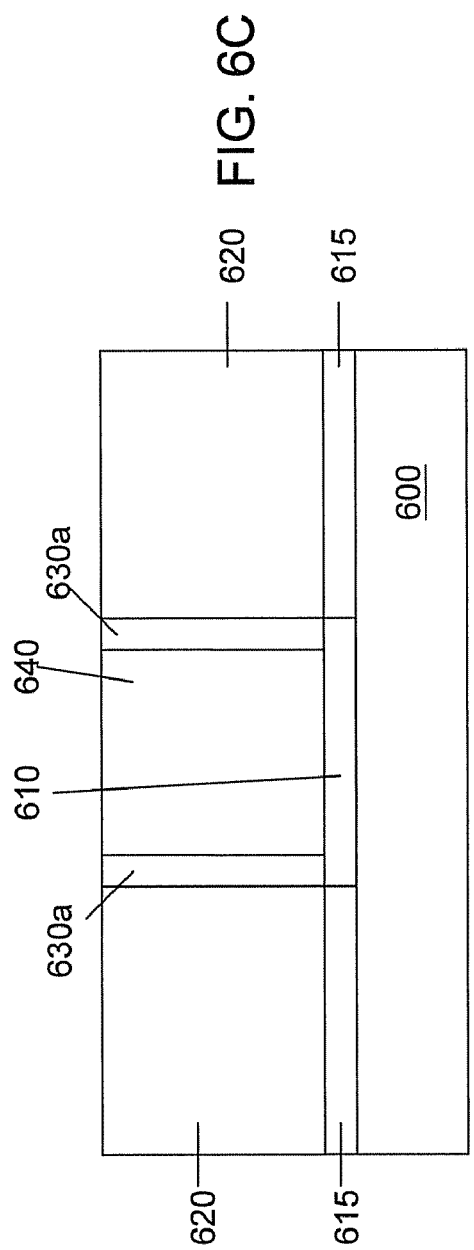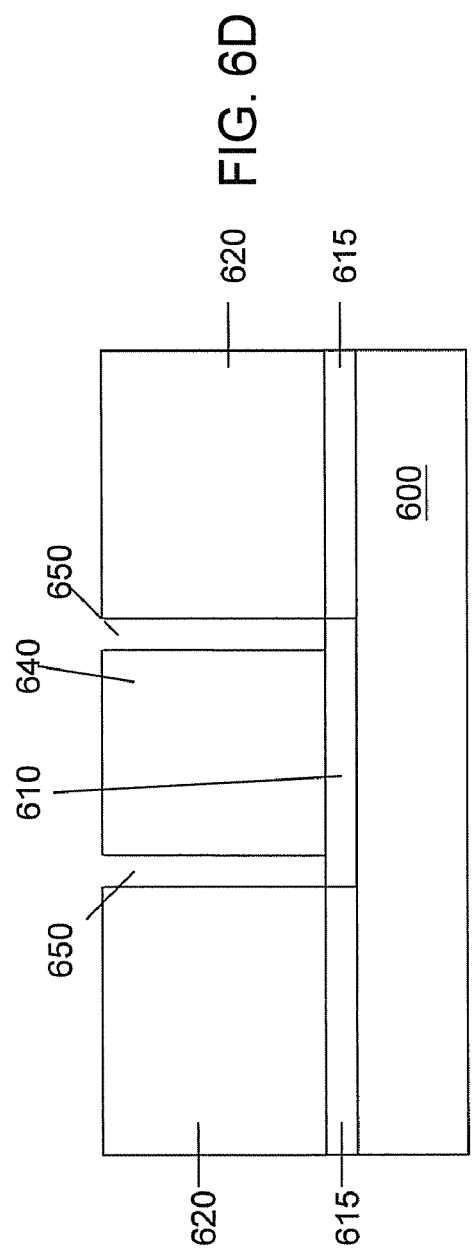

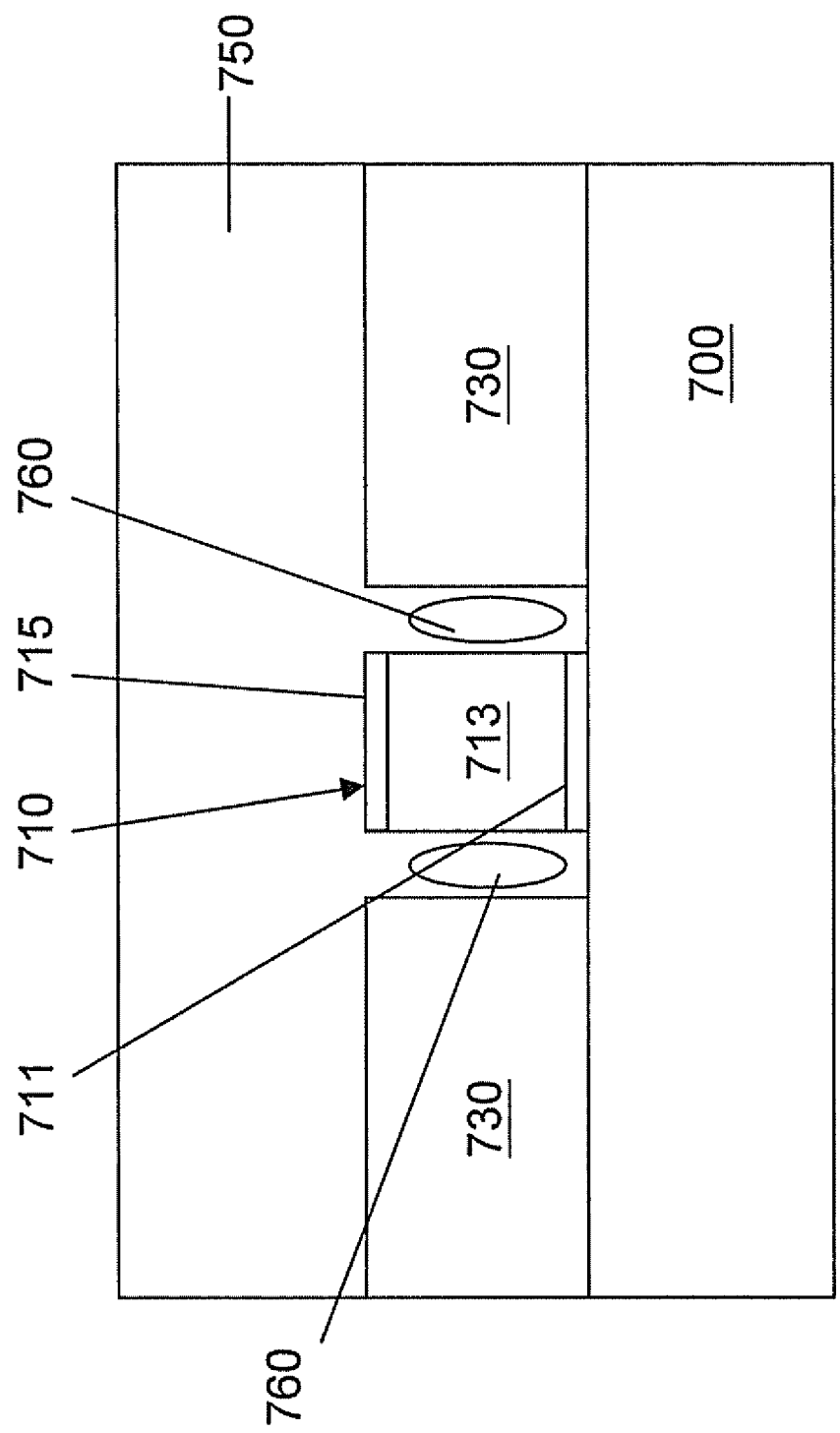

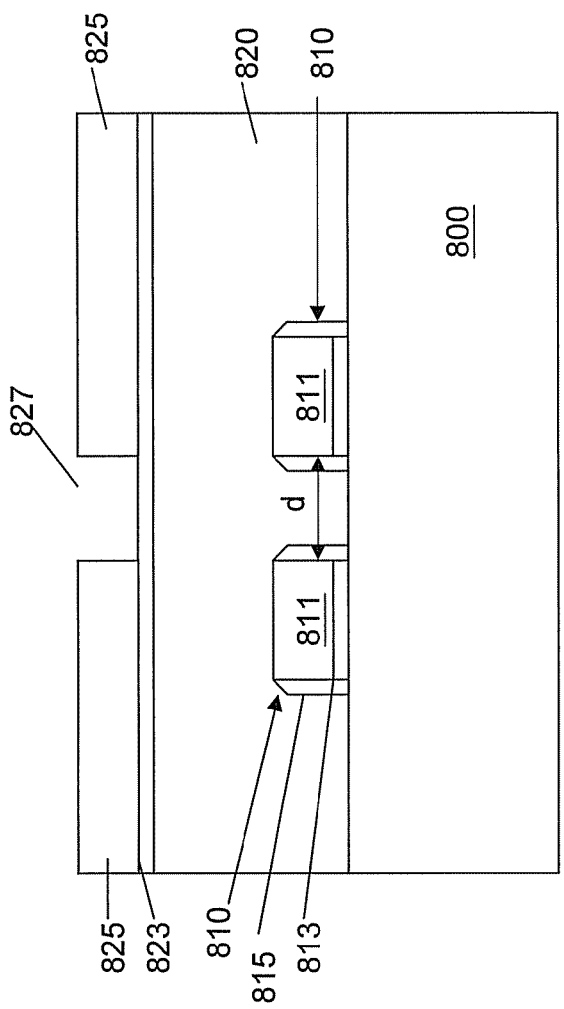
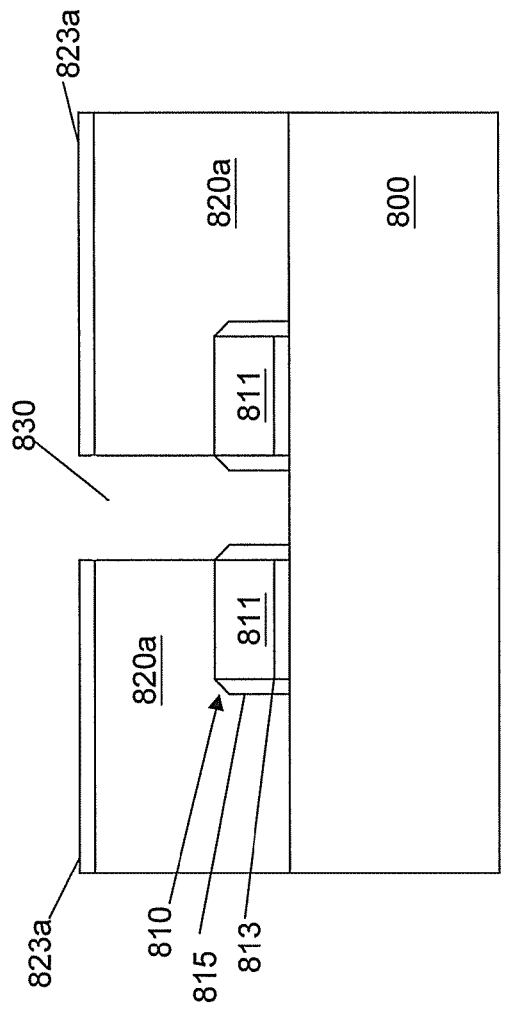
FIG. 8A
FIG. 8B

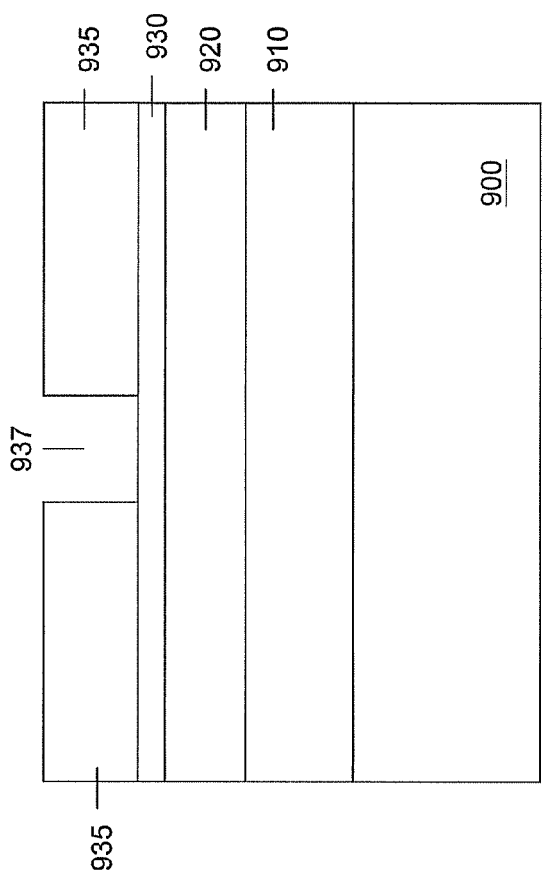
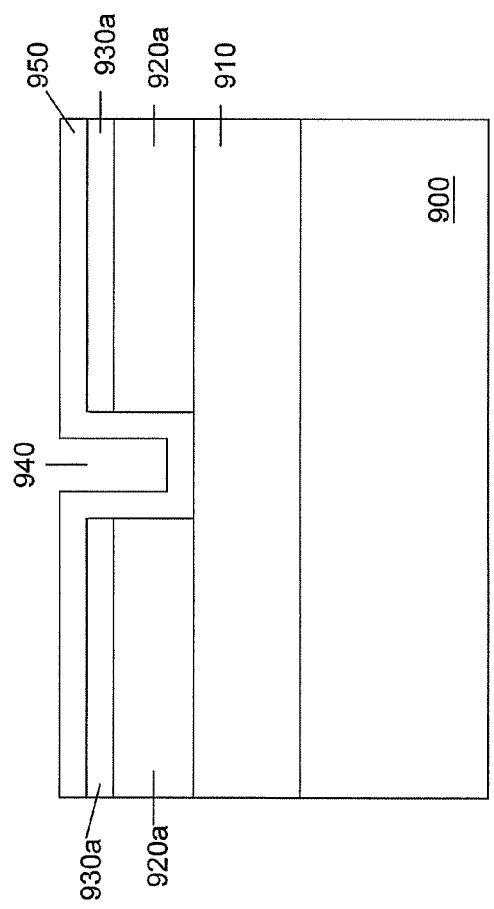

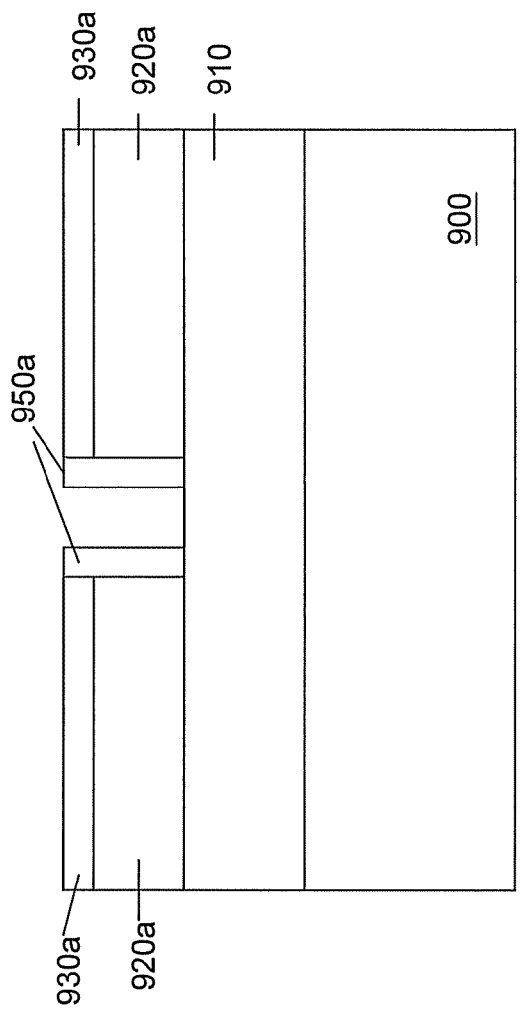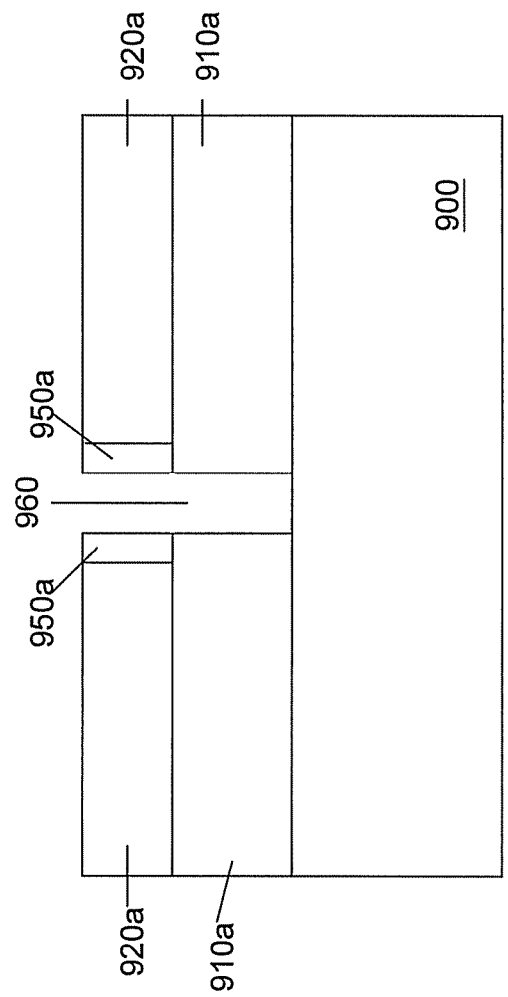

METHOD OF FORMING A SEMICONDUCTOR CAPACITOR USING AMORPHOUS CARBON

CROSS REFERENCE TO RELATED APPLICATIONS

This application is a division of, and claims priority to, U.S. patent application Ser. No. 11/461,673 filed on Aug. 1, 2006, now abandoned, which is incorporated by reference herein in its entirety.

BACKGROUND OF THE INVENTION

1. Field of the Invention

The present invention relates to semiconductor methods, and more particularly to semiconductor methods related to amorphous carbon layers.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high integration and speed targets, dimensions of semiconductor integrated circuits have been reduced and various materials, such as amorphous carbon, have been proposed along with techniques for overcoming manufacturing obstacles associated with these materials.

Amorphous carbon is a new material used in semiconductor technology. An amorphous carbon layer can be formed substantially conformally over a semiconductor structure over a substrate by a chemical vapor deposition (CVD) process. In addition, the amorphous carbon layer has a desired thermal stability even between about 400° C. and about 550° C. The amorphous carbon layer will not crack in this temperature range. (The temperature range would result in cracking of organic material, such as photoresist.) Further, the amorphous carbon layer can be removed by an oxygen plasma that is used to remove a photoresist layer as well. Thus, an amorphous carbon layer can serve as a hard mask and/or anti-reflection coating (ARC) layer under a photoresist layer to form a via/contact plug in nanometer level semiconductor technology.

FIGS. 1A-1C are schematic cross-sectional views illustrating a process for formation of a via/contact plug.

Referring to FIG. 1A, an oxide layer 110, an amorphous carbon layer 120, an oxynitride layer 130 and photoresist layer 135 are sequentially formed over a substrate 100. The photoresist layer 135 includes an opening 137 therein for forming a via/contact hole in FIG. 1B.

A portion of the amorphous carbon layer 120 and a portion of the oxynitride layer 130 are removed by an etch process to form an opening 140 within the amorphous carbon layer 120a as shown in FIG. 1B. The photoresist layer 135 is then removed by a photoresist removal process. For some semiconductor processes, the removal of the photoresist layer 135 and the partial removals of the amorphous carbon layer and oxynitride layer for forming the opening 140 are performed by the same etch process.

Referring to FIG. 1C, the oxynitride layer 130a and the amorphous carbon layer 120a are removed. The amorphous carbon layer 120a can be removed by oxygen plasma. A metal layer 150 is then formed within the opening 140.

SUMMARY OF THE INVENTION

In accordance with some exemplary embodiments, a method includes forming an amorphous carbon layer over a first dielectric layer formed over a substrate, forming a second dielectric layer over the amorphous carbon layer; and forming an opening within the amorphous carbon layer and second dielectric layer by a first etch process to partially expose a top surface of the first dielectric layer. A substantially conformal metal-containing layer is formed over the second dielectric layer and within the opening. The second dielectric layer and a portion of the metal-containing layer are removed. The amorphous carbon layer is removed by an oxygen-containing plasma process to expose a top surface of the first dielectric layer. An insulating layer is formed over the metal-containing layer, and a second metal-containing layer is formed over the insulating layer to form a capacitor.

In some embodiments, a method of forming a capacitor over a substrate includes forming an amorphous carbon layer over the substrate, forming a first dielectric layer over the amorphous carbon layer, and forming an opening in the first dielectric layer and the amorphous carbon layer by a first etch process to expose a top surface of the substrate. A first metal-containing layer is formed over the first dielectric layer and the amorphous carbon layer. The first metal-containing layer is disposed within the opening and over the top surface of the substrate. A portion of the first metal-containing layer and the first dielectric layer is removed. The amorphous carbon layer is removed by an oxygen-containing plasma process to expose outer sidewalls of the first metal-containing layer. An insulating layer is formed over the first metal-containing layer. The insulating layer covers the outer sidewalls of the first metal-containing layer. A second metal-containing layer is formed over the insulating layer.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 1A-1C are schematic cross-sectional views illustrating a process for formation of a via/contact plug.

FIGS. 2A-2E are schematic cross-sectional views illustrating a process for formation of a shallow trench isolation (STI) structure.

FIGS. 3B-3G are schematic cross-sectional views illustrating a process for formation of the crown metal capacitor of FIG. 3A.

FIGS. 4A-4E are schematic cross-sectional views illustrating a process for formation of a select gate of a flash transistor.

FIGS. 5A-5D are schematic cross-sectional views illustrating a process for formation of a source/drain region of a transistor.

FIGS. 6A-6E are schematic cross-sectional views illustrating a process for formation of air gaps over a pixel.

FIGS. 7A-7E are schematic cross-sectional views illustrating a process for formation of air gaps next to a conductive layer.

FIGS. 8A-8F are schematic cross-sectional views illustrating a process for formation of a self-aligned contact plug.

FIGS. 9A-9E are schematic cross-sectional views illustrating a process for formation of a via/contact plug or a conductive line.

DESCRIPTION OF THE PREFERRED EMBODIMENT

Figure 1C:
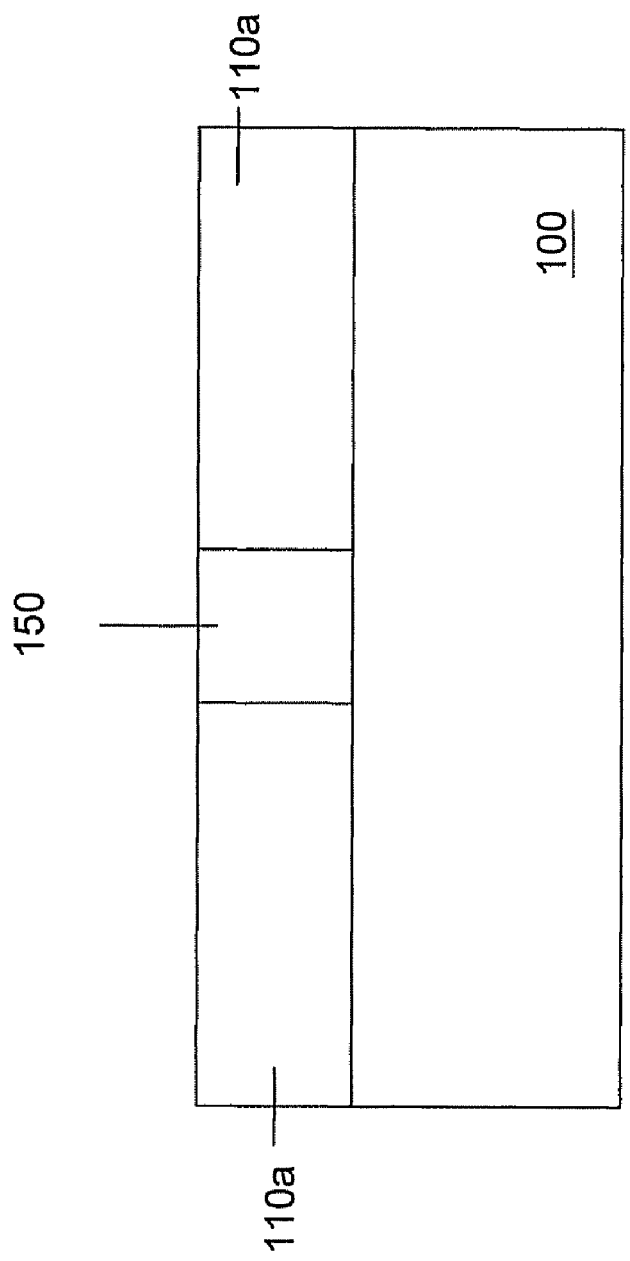

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2E are schematic cross-sectional views illustrating a process for formation of a shallow trench isolation (STI) structure.

Figure 2A:
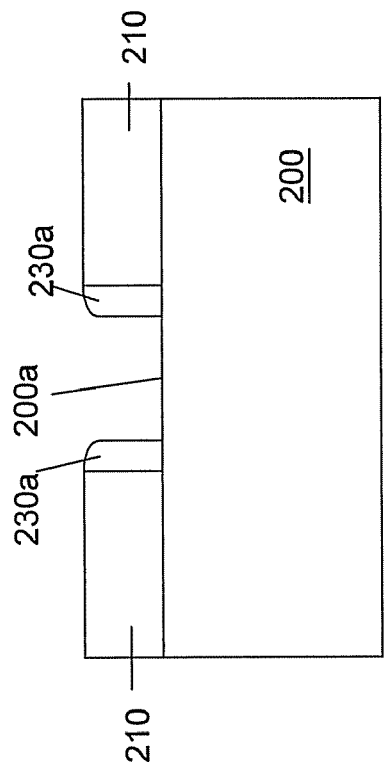

Referring to FIG. 2A, a dielectric layer 210 including an opening 220 therein is formed over a substrate 200. The opening 220 exposes a portion of a top surface 200a of the substrate 200. The substrate 200 can be a semiconductor substrate, display substrate such as a liquid crystal display (LCD), plasma display, cathode ray tube display or electro luminescence (EL) lamp display, or light emitting diode (LED) substrate (collectively referred to as, substrate 200), for example. The dielectric layer 210 can be, for example, an oxide layer, nitride layer, oxynitride layer or other dielectric layer that is adapted to be a hard mask layer. The dielectric layer 210 can be formed, for example, by a chemical vapor deposition (CVD) method, physical vapor deposition (PVD) method, spin-on method or other method that is adapted to form a dielectric material over the substrate 200. In some embodiments of 90-nm or 65-nm semiconductor technology, the dielectric layer 210 can be a silicon nitride layer, for example. In such embodiments, the dielectric layer 210 from the top surface 200a of the substrate 200 to the top surface of the dielectric layer 210 has a thickness of about 800 Å to about 1,200 Å. In addition, the opening 220 between the sidewalls of the dielectric layer 210 has a width of about 800 Å to about 1,500 Å.

A substantially conformal material 230 is formed over the dielectric layer 210 and the opening 220. The material layer 230 can be removed by an oxygen-containing plasma process. The material layer 230 can be, for example, an amorphous carbon layer. In some embodiments of 90-nm or 65-nm semiconductor technology, the material layer 230 has a thickness of about 150 Å to about 250 Å from the top surface of the dielectric layer 210 to the top surface of the material layer 230.

In some embodiments, a material layer 230, such as an amorphous carbon layer, can be formed by a low deposition rate process to obtain a substantially conformal layer over the dielectric layer 210 and the opening 220. An exemplary low deposition rate process includes: a flow of $C_3H_6$ between about 1,000 standard cubic centimeters per minute (sccm) and about 1,500 sccm; a flow of He between about 400 sccm and about 500 sccm; a radio-frequency (RF) power between about 800 watts and about 1,200 watts; and a pressure between about 3.5 Torr and about 4.5 Torr. In other embodiments, the material layer 230 can be formed by a high deposition rate process as long as the conformity of the material layer 230 is desired. An exemplary high deposition rate process includes: a flow of $C_3H_6$ between about 1,500 standard cubic centimeters per minute (sccm) and about 2,500 sccm; a flow of He between about 500 sccm and about 900 sccm; a radio-frequency (RF) power between about 1,200 watts and about 1,800 watts; and a pressure between about 4.5 Torr and about 5.5 Torr.

Figure 2B:
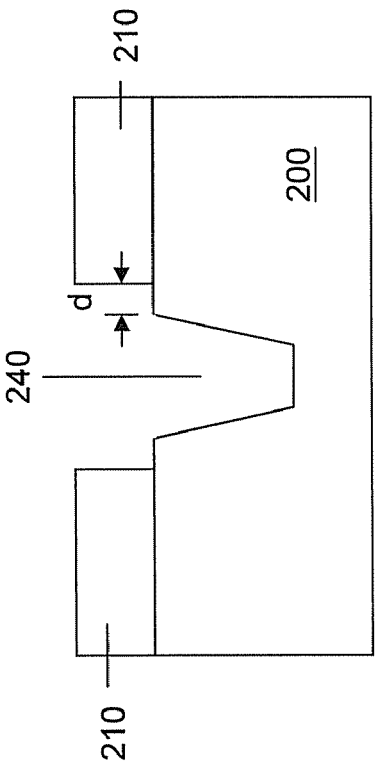

Referring to FIG. 2B, a portion of the material layer 230 is removed by an etch process to form material spacers 230a on sidewalls of the dielectric layer 210. In some embodiments, the material spacers 230a are not substantially laterally etched by the etch process, so that a desired profile of the material spacers 230a is achieved. In order to obtain the desired profile of the material spacers 230a, the etch process may include: a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr.

Figure 2C:
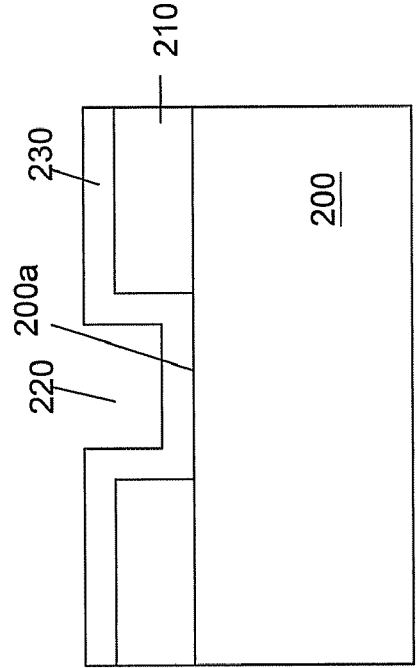

Referring to FIG. 2C, a trench 240 is formed within the substrate 200 by using the first dielectric layer 210 and the material spacers 230a as a hard mask. The trench 240 can be formed, for example, by an etch process that has a desired etch selectivity for the material of the substrate, such as silicon, to the first dielectric layer 210, such as silicon nitride, and the material spacers 230a, such as amorphous carbon, so that the etch process does not substantially laterally etch the material spacers 230a. In some embodiments of 90-nm or 65-nm semiconductor technology, the trench 240 has a depth of about 2,800 Å to about 3,800 Å. With the desired profile of the material spacers 230a as described above, a desired trench profile can be obtained.

Figure 2D:
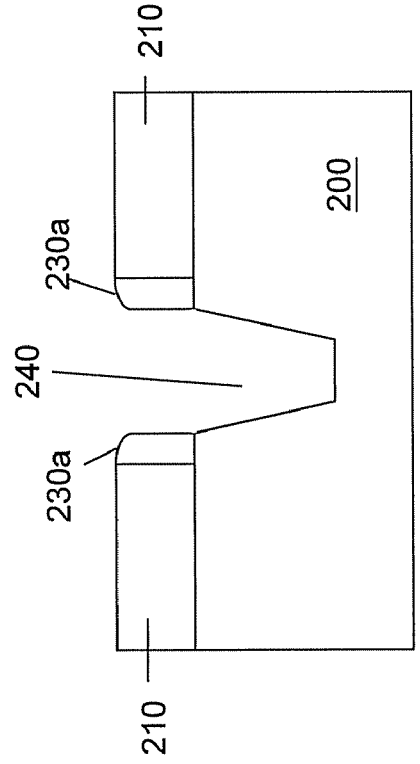

Referring to FIG. 2D, the material spacers 230a are removed by an oxygen-containing plasma process. After the removal of the material spacers 230a, the opening is increased by a pull-back distance "d" from the sidewall of the dielectric layer 210 to the top edge of the trench 240. By increasing the opening size by the distance "d", i.e., extending the opening between the dielectric layer 210 over the trench 240, a dielectric layer (not shown) can be properly filled within the trench 240 and the opening between the dielectric layer 210 in a subsequent process. The oxygen-containing plasma process removes the material spacers 230a. In some embodiments, the material spacers 230a can be removed by an ash process that has a high etch rate, if the ash process does not substantially damage the profile of the trench 240. In some embodiments, in which the material spacers 230a include amorphous carbon, the ash process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

In some embodiments, the etch process for the formation of the material spacers 230a as shown in FIG. 2B can be used to remove the material spacers 230a, if the desired removal rate of the material spacers 230a can be achieved and the profile of the trench 240 is not substantially damaged. Further, the oxygen-containing plasma process for the removal of the material spacers 230a can be used for the formation of the material spacers 230a, if the desired profile of the material spacers 230a can be formed. One of ordinary skill in the art can readily use the etch process and oxygen-containing plasma process to obtain a desired profile of the material spacers 230a and/or to remove the material spacers 230a.

Referring to FIG. 2E, a dielectric layer 250 is filled within the trench 240. The steps of forming of the dielectric layer 250 within the trench include: forming a dielectric material layer 250 within the trench 240; and removing the dielectric layer 210 and a portion of the dielectric material layer 250 over the top surface of the substrate 200. In some embodiments, the dielectric layer 250 can be, for example, a high density plasma (HDP) dielectric layer or other dielectric layer that can isolate two active regions of the substrate 200. The HDP dielectric layer can be formed, for example, by a HDP CVD. The dielectric layer 210 and the portion of the dielectric material layer over the top surface of the substrate 200 can be removed, for example, by an etch-back process or chemical mechanical polishing (CMP) process. As described above, the pull-back distance "d" allows the dielectric material layer 250 be properly filled within the trench 240 and the opening between the dielectric layers 210. Accordingly, a desired STI structure is formed.

The dimensions of the dielectric layers, material layer and trench set forth above are illustrated by 90-nm or 65-nm semiconductor technology. The present invention is not limited thereto. One of ordinary skill in the art can understand that these physical characteristics vary with the applied semiconductor process and readily form a desired STI structure.

Figure 3A:
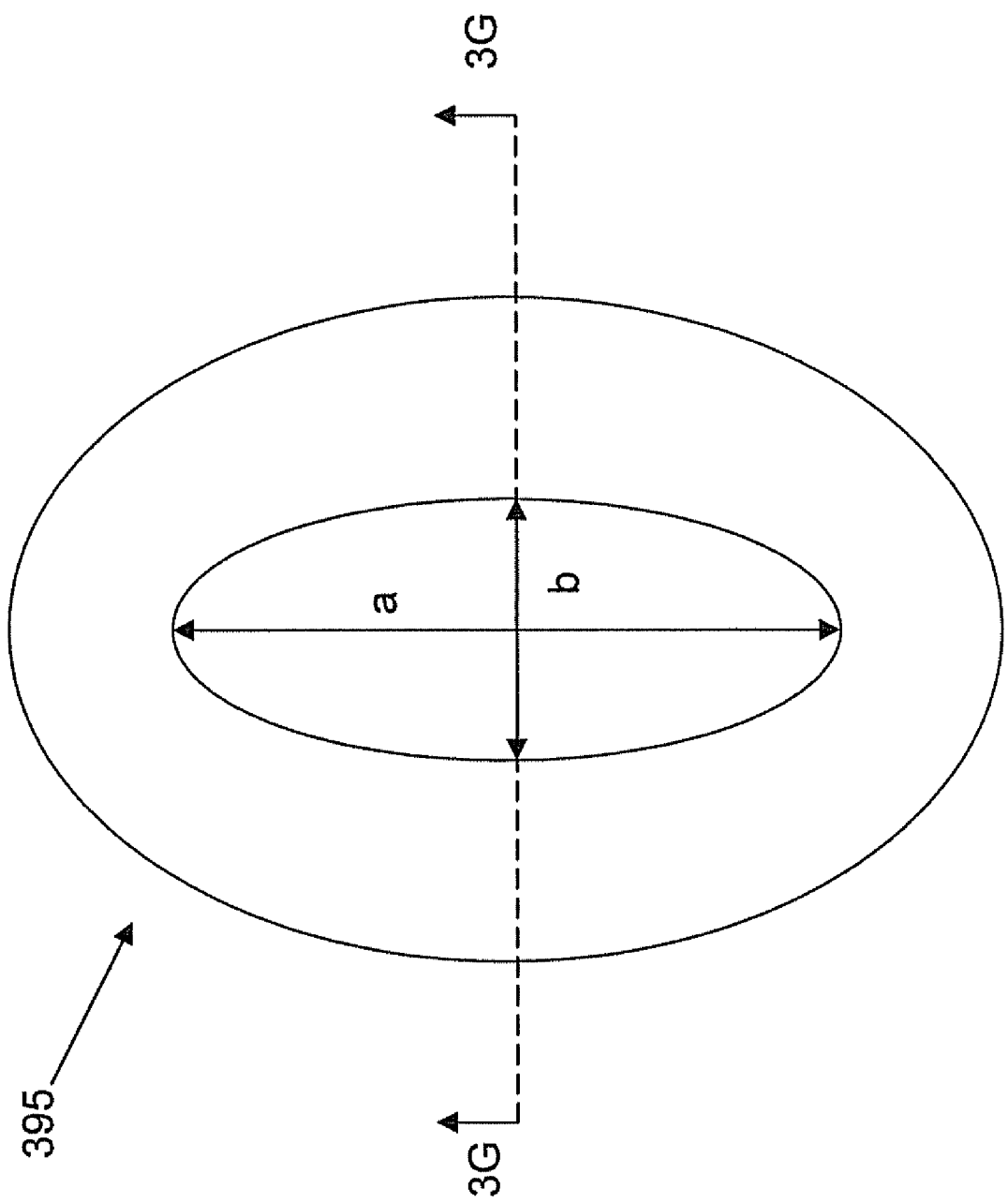
FIG. 3A is a schematic top view of a crown metal capacitor.

FIG. 3A is a schematic top view of a crown metal capacitor. FIGS. 3B-3G are schematic cross-sectional views illustrating a process for formation of the crown metal capacitor of FIG. 3A.

Referring to FIG. 3A, the metal-insulator-metal (MIM) capacitor 395 can have, for example, a circle shape, oval shape, square shape, or rectangular shape. In some embodiments, an oval shape MIM capacitor 395 includes a long-axis "a" of about 0.15 μm to about 0.25 μm and a short-axis "b" of about 0.07 μm to about 0.15 μm.

Figure 3B:
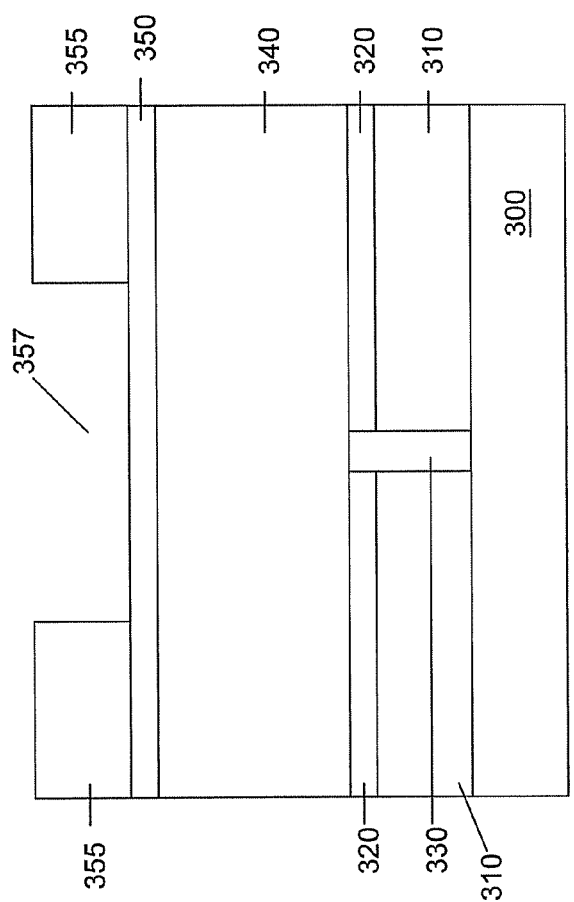

Referring to FIG. 3B, dielectric layers 310 and 320 are sequentially formed over a substrate 300. A conductive layer 330 is formed within the dielectric layers 310 and 320. The substrate 300 is similar to the substrate 200 as set forth above. In some embodiments, the substrate 300 can include at least one transistor or device (not shown) thereon in contact with the conductive layer 330. The dielectric layer 310 can be, for example, an oxide layer, low-k dielectric layer or other dielectric layer that can isolate two conductive structures, such as metal lines or via/contact plugs. The dielectric layer 310 can be formed, for example, by a CVD process, PVD process, spin-on process or other method that can form a dielectric layer over the substrate 300. The dielectric layer 320 can be, for example, a nitride layer, oxynitride layer or other material layer that can protect the dielectric layer 310 from exposure to a subsequent dry or wet etch process or photolithographic process. The dielectric layer 320 can be formed, for example, by a CVD process, PVD process, spin-on process or other method that can form a dielectric layer over the substrate 300. In some embodiments of 90-nm or 65-nm semiconductor technology, the dielectric layer 310 is an oxide layer and the dielectric layer 320 is an oxynitride layer, for example. In the example of FIG. 3B, the dielectric layer 320 has a thickness of about 200 Å to about 300 Å.

The conductive layer 330 is formed within the dielectric layers 310 and 320 to electrically connect a transistor or device (not shown) over the substrate 300 and a bottom electrode of a capacitor, i.e., the metal-containing layer 370a (shown in FIG. 3F). The conductive layer 330 can be, for example, a tungsten plug, aluminum/copper plug, copper plug or other conductive layer that can connect a transistor and a bottom electrode of a capacitor. The conductive layer 330 can be formed, for example, by CVD, PVD, chemical electrical plating, chemical electroless plating method or other method that can form the conductive layer 330. In some embodiments, an etch-back or CMP process is applied to remove the material of the conductive layer 330, which is formed over the top surface of the dielectric layer 320 by a CVD method or PVD method. In other embodiments, the etch-back or CMP process is not used, if the conductive layer 330 is formed beginning from the top surface of the substrate 300 and stopping at the region proximate to the top surface of the dielectric layer 320 by a chemical electrical plating method or chemical electroless plating method.

A material layer 340 is formed over the conductive layer 330 and the dielectric layer 320. The material layer 340 can be removed by an oxygen-containing plasma process. The material layer 340 can be, for example, an amorphous carbon layer. In some embodiments of 90-nm or 65-nm semiconductor technology, the material layer 340 has a thickness of about 2,500 Å to about 6,000 Å.

In some embodiments, the material layer 340, such as an amorphous carbon layer, can be formed by a high deposition rate process to obtain a material layer over the dielectric layer 320 and the conductive layer 330. A high deposition rate process can reduce the processing time for the formation of the MIM capacitor. In some embodiments, the high deposition rate process includes: a flow of $C_3H_6$ between about 1,500 standard cubic centimeters per minute (sccm) and about 2,500 sccm; a flow of He between about 500 sccm and about 900 sccm; a radio-frequency (RF) power between about 1,200 watts and about 1,800 watts; and a pressure between about 4.5 Torr and about 5.5 Torr. In other embodiments, the material layer 340 can be formed by a low deposition rate process as long as the deposition rate of the material layer 340 is desired. In some embodiments, the low deposition rate process includes: a flow of $C_3H_6$ between about 1,000 standard cubic centimeters per minute (sccm) and about 1,500 sccm; a flow of He between about 400 sccm and about 500 sccm; a radio-frequency (RF) power between about 800 watts and about 1,200 watts; and a pressure between about 3.5 Torr and about 4.5 Torr.

A dielectric layer 350 is formed over the material layer 340. The dielectric layer 350 can be, for example, a nitride layer, oxynitride layer or other material layer that is adapted to be a hard mask for an etch process or CMP process. In some embodiments of 90-nm or 65-nm semiconductor technology, the dielectric layer 350 can be an oxynitride layer, for example, and has a thickness of about 600 Å to about 1,000 Å.

A photoresist layer 355 including an opening 357 therein is formed over the dielectric layer 350. The opening 357 exposes a portion of the top surface of the dielectric layer 350. The opening 357 can be defined by a photolithographic process. The opening 357 defines dimensions of the metal capacitor 395.

The dielectric layer 350 protects the material layer 340 from being removed if the process for removing the photoresist layer 355 also substantially removes the material layer 340.

Figure 3C:
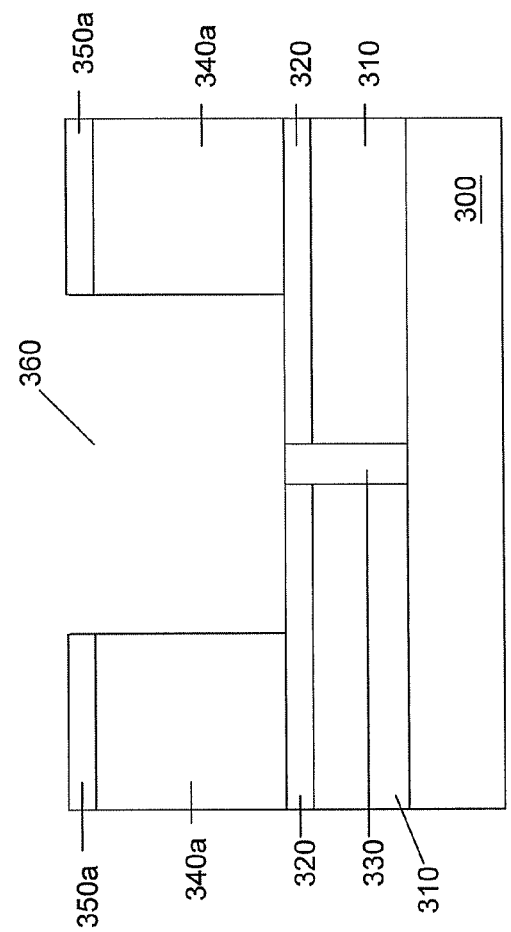

Referring to FIG. 3C, an opening 360 is formed within the material layer 340 and the dielectric layer 350 to expose a portion of the top surface of the dielectric layer 320 and a top surface of the conductive layer 330. The opening 360 is defined based on the opening 357 shown in FIG. 3B. The steps for forming opening 360 include, for example, removing a portion of the dielectric layer 350 and a portion of the material layer 340. The process for removing the portion of the dielectric layer 350, for example, can have a desired etch selectivity for the dielectric layer 350 to the material layer 340. The etch process for removing the portion of the material layer 340, for example, can have a desired etch selectivity for the material layer 340 to the dielectric layers 320 and/or 350, e.g., oxynitride layer.

In some embodiments, the etch process has a desired selectivity for the material layer 340 to the dielectric layers 320 and/or 350 so that the etch process does not substantially damage the dielectric layers 320 and/or 350. In some embodiments, the remaining material 340a are not substantially laterally etched by the etch process, so that a desired profile of the opening 360 is achieved. In order to obtain the desired profile of the opening 360, in some embodiments, the etch process includes a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr. In other embodiments, in which the profile of the opening 360 is not a concern, the etch process includes a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr. After the formation of the opening 360, the photoresist layer 355 is removed. The removal process of the photoresist layer 355 can be, for example, a traditional photoresist removal process. In other embodiments, the photoresist layer 355 is removed while the dielectric layer 350 and material layer 340 are partially removed. In other words, the opening 360 is formed within the dielectric layer 350a and remaining material layer 340a while the photoresist layer 355 is substantially removed.

Figure 3D:
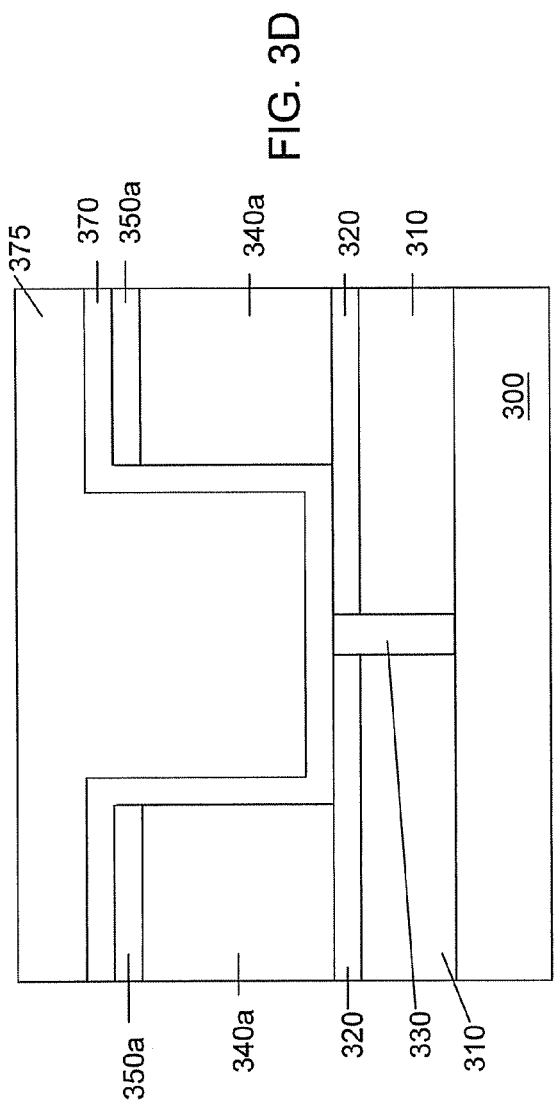

Referring to FIG. 3D, a substantially conformal metal-containing layer 370 is formed over the dielectric layer 350 and the opening 360. A photoresist layer 375 is then formed over the metal-containing layer 370 and within the opening 360. The metal-containing layer 370 can be, for example, a titanium nitride (TiN) layer or other metal-containing layer that can be a bottom electrode of a metal-insulator-metal (MIM) capacitor. The metal-containing layer 370 can be formed, for example, by a CVD process, PVD process, atomic layer deposition (ALD) process or other process that can form the metal-containing layer 370. In some embodiments of 90-nm or 65-nm semiconductor technology, the metal-containing layer 370 has a thickness of about 150 Å to about 300 Å. The photoresist layer 375 can be formed, for example, by a traditional photolithographic process.

Figure 3E:
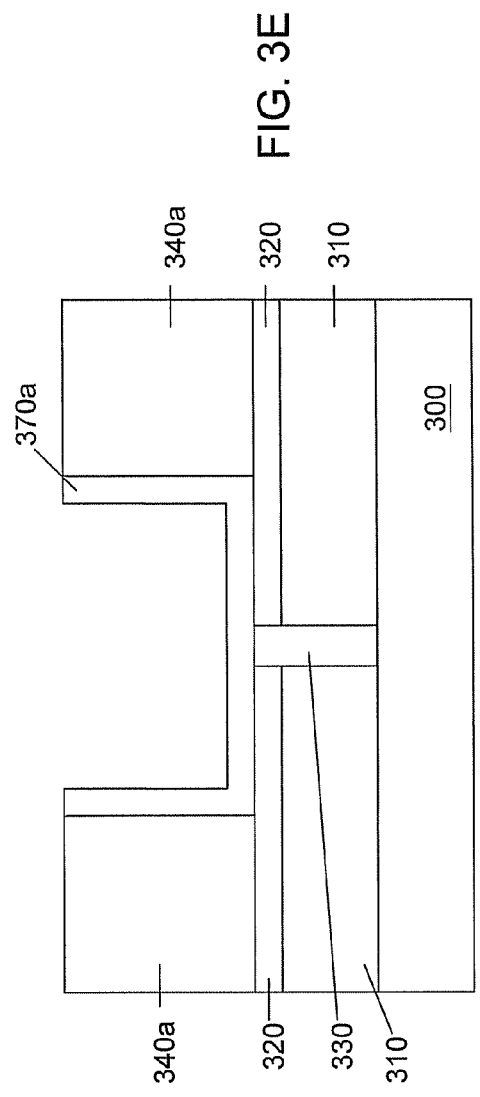

Referring to FIG. 3E, a top portion of the photoresist layer 375, a portion of the metal-containing layer 370 and the dielectric layer 350a are removed. The photoresist layer 375 within the opening 360 is then removed. In some embodiments, the top portion of the photoresist layer 375, the portion of the metal-containing layer 370 and the dielectric layer 350a can be removed by a sequence of etch processes. In other embodiments, the top portion of the photoresist layer 375, the portion of the metal-containing layer 370 and the dielectric layer 350 can be removed by a CMP process. Then, the remaining photoresist layer 375 within the opening 360 is removed by a photoresist removal process, which may be a traditional process, for example. After the removal of the remaining photoresist layer 375, the metal-containing layer 370a is formed within the opening 360, substantially covering sidewalls of the material layer 340 and the portion of the top surface of the dielectric layer 320 thereunder.

Referring to FIG. 3F, the material layer 340a is removed by an oxygen-containing plasma process to expose a portion of outer sidewalls 370b of the metal-containing layer 370a. During the plasma process, the dielectric layer 320 can be an etch-stop layer to protect the dielectric layer 310 from being damaged. For example, the plasma process has a desired etch selectivity for the material layer 340a to the dielectric layer 320 so that the plasma process can remove the material layer 340a without substantially damaging the dielectric layer 320. Further, the plasma process does not substantially damage the metal-containing layer 370a, i.e., the bottom electrode of the capacitor 395 (shown in FIG. 3A). In some embodiments, the ash process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

Due to the exposed outer sidewalls 370b of the metal-containing layer 370, the surface area of the capacitor 395 is thus increased. The capacitance of the capacitor 395 is also enhanced.

In some embodiments, a portion of the material layer 340a remains on the outer sidewalls 370b of the metal-containing layer 370a, if the remaining material layer 340a does not adversely affect electrical performance of the transistor (not shown) over the substrate 300 and the capacitor 395, and/or subsequent process, such as wafer contamination or film cracking when the material layer 340a is subjected to thermal treatments. Also, the remaining portion of the material layer 340a reduces the area of the outer sidewalls 370b of the metal-containing layer 370a. The area and capacitance of the capacitor 395 are thus reduced.

FIG. 3G is a schematic cross-sectional view of the capacitor 395 shown in FIG. 3A taken along section line 3G-3G. Referring to FIG. 3G, a capacitor insulator 380 and a metal-containing layer 370, i.e., a top electrode of the capacitor 395, are formed over the metal-containing layer 370a, i.e., the bottom electrode of the capacitor 395, and the dielectric layer 320. The capacitor insulator 380 substantially covers the exposed outer sidewalls 370b, top regions and inner sidewalls of the metal-containing layer 370. The metal-containing layer 390 substantially covers the capacitor insulator layer 380. The capacitor insulator 380 can be, for example, an aluminum oxide layer, tantalum oxide layer, zinc oxide layer or other material layer that has a high dielectric constant and is adapted for the MIM capacitor 395. The capacitor insulator 380 can be formed, for example, by a CVD process, PVD process, atomic layer deposition (ALD) process or other process that can form the capacitor insulator 380. The metal-containing layer 390 can be, for example, a TiN layer which can be formed, for example, by a CVD process, PVD process, atomic layer deposition (ALD) process or other process that can form a metal top electrode.

The dimensions of the dielectric layers, material layer and metal-containing layers set forth above are illustrated for examples using 90-nm or 65-nm semiconductor technology. The present invention is not limited thereto. One of ordinary skill in the art can understand that these physical characteristics vary with the applied semiconductor process and can readily form a desired MIM capacitor.

FIGS. 4A-4E are schematic cross-sectional views illustrating a process for formation of a select gate of a flash transistor.

Referring to FIG. 4A, a pair of flash transistor gates 410 are formed over a substrate 400. The substrate 400 may be similar to the substrate 200 described above. The flash transistor gate 410 includes a gate insulator 411, a floating gate 413, an inter-gate insulator 415, a coupling gate 417, a cap layer 419 and spacers 412. The gate insulator 411 can be, for example, an oxide layer, nitride layer, oxynitride layer or other insulator layer. The gate insulator 411 can be formed, for example, by a CVD process, PVD process, atomic layer deposition (ALD) process or other process that can form the insulator 411. The floating gate 413 can be, for example, a polysilicon layer which can be formed, for example, by a CVD process, PVD process, atomic layer deposition (ALD) process or other process that can form the floating gate 413. The inter-gate insulator 415 can be, for example, an oxide layer, nitride layer, oxynitride layer, nitride/oxide (NO) layer, oxide/nitride/oxide (ONO) layer or other insulator layer. The inter-gate insulator 415 can be formed, for example, by a CVD process, PVD process, atomic layer deposition (ALD) process or other process that can form the inter-gate insulator layer 415. The coupling gate 417 can be, for example, a polysilicon layer which can be formed, for example, by a CVD process, PVD process, atomic layer deposition (ALD) process or other process that can form the coupling gate 417. The cap layer 419 and the spacers 412 can be, for example, an oxide layer, nitride layer, oxynitride layer or other insulator layer. The cap layer 419 and the spacers 412 can be formed, for example, by a CVD process, PVD process, atomic layer deposition (ALD) process or other process that can form the cap layer 419 and the spacers 412.

In some embodiments of 90-nm or 65-nm semiconductor technology, the gate insulator 411, such as an oxide layer, has a thickness of about 90 Å to about 150 Å; the floating gate 413, such as a polysilicon layer, has a thickness of about 500 Å to about 800 Å; the inter-gate insulator 415, such as an ONO layer, has a thickness of about 35/35/45 Å to about 65/65/85 Å, respectively; the coupling gate 417, such as a polysilicon layer, has a thickness of about 500 Å to about 1,000 Å; the cap layer 419, such as an oxide layer, has the a thickness of about 700 Å to about 1,200 Å; the thickest portion of the spacer 412, such as a nitride spacer, has a width of about 200 Å to about 500 Å; and the gap 405 between the sidewalls of the floating gates 413 has a width of about 1,000 Å to about 2,000 Å.

A sacrificial layer 420 is formed, covering the flash transistor gates 410 and filling within the gap 405 between the flash transistor gates 410. The sacrificial layer 420 can be, for example, a material layer that can be removed by an oxygen-containing plasma process, or a dielectric layer, such as an oxide layer or nitride layer. In some embodiments, the material layer comprises an amorphous carbon layer. In some embodiments of 90-nm or 65-nm semiconductor technology, the sacrificial layer 420 has a thickness of about 2,000 Å to about 3,000 Å.

In some embodiments, the sacrificial layer 420 is an amorphous carbon layer. The sacrificial layer 420 is similar to the material layer 340 described above. Detailed descriptions are not repeated.

Referring to FIG. 4B, a portion of the sacrificial layer 420 is removed by an etch process to form the remaining sacrificial layer 420a within the gap. The sacrificial layer 420a includes a top surface, lower than or substantially equal to a top region of the flash transistor gate 410, such as the top surface 410a of the flash transistor gate 410. Due to the large thickness of the sacrificial layer 420 between the flash transistor gates 410 and/or the aspect ratio, i.e., depth/width, of the gap 405, the sacrificial layer 420a remains within the gap 405 between the flash transistor gates 410, when the sacrificial layer 420 outside of the gap 405 between the flash transistor gates 410 is completely removed. In some embodiments of 90-nm or 65-nm semiconductor technology, the highest portion of the sacrificial layer 420a has a dimension of about 1,000 Å to about 2,500 Å.

In some embodiments, the sacrificial layer 420 can be removed by an etch process that has a desired etch rate, if the etch process does not substantially damage the substrate 400.

In some embodiments in which the sacrificial layer 420 includes amorphous carbon, the etch process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr. In other embodiments, the etch process has a desired selectivity of about 80:1 to about 120:1 for the sacrificial layer 420, such as an amorphous carbon layer, to the spacers 412, such as nitride spacers. The etch process includes a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr.

Figure 4C:
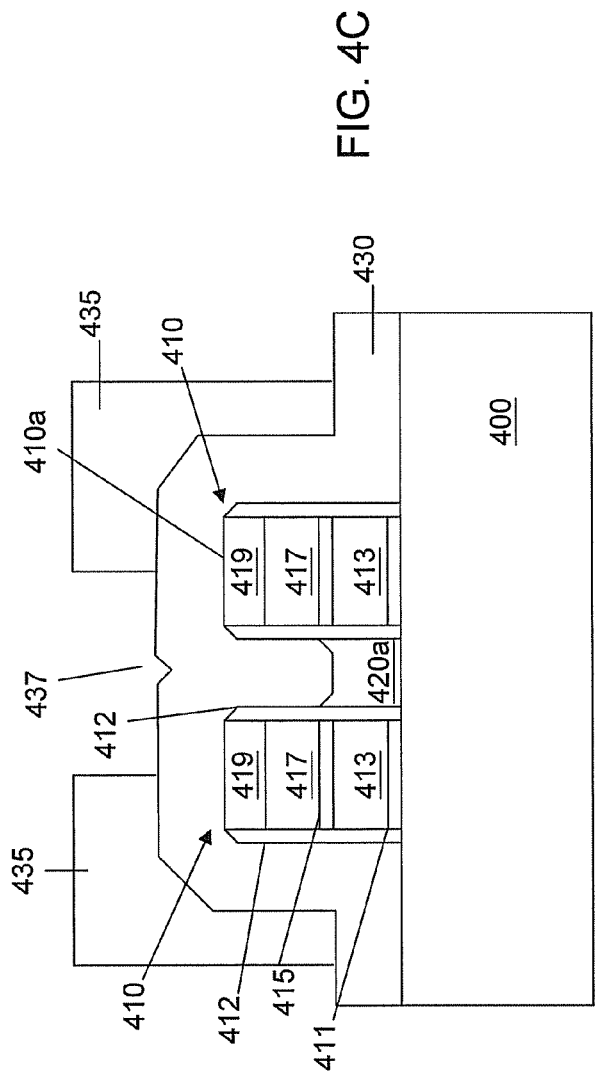

Referring to FIG. 4C, a conductive layer 430 is formed, covering the flash transistor gates 410, the sacrificial layer 420a and the substrate 400. The conductive layer 430 can be, for example, a polysilicon layer, aluminum layer, copper layer, aluminum/copper layer or other conductive material layer. The conductive layer 430 can be formed, for example, by a CVD process, PVD process, chemical plating process or other process that can form the conductive layer 430. In some embodiments of 90-nm or 65-nm semiconductor technology, the conductive layer 430, such as a polysilicon layer, has a thickness of about 1,500 Å to about 2,000 Å from the top surface 410a of the flash gate transistor 410 to the top surface of the conductive layer 430.

A photoresist layer 435 including an opening 437 therein is formed over the conductive layer 430. The photoresist layer 435 including the opening 437 therein can be formed by a photolithographic process.

Figure 4D:
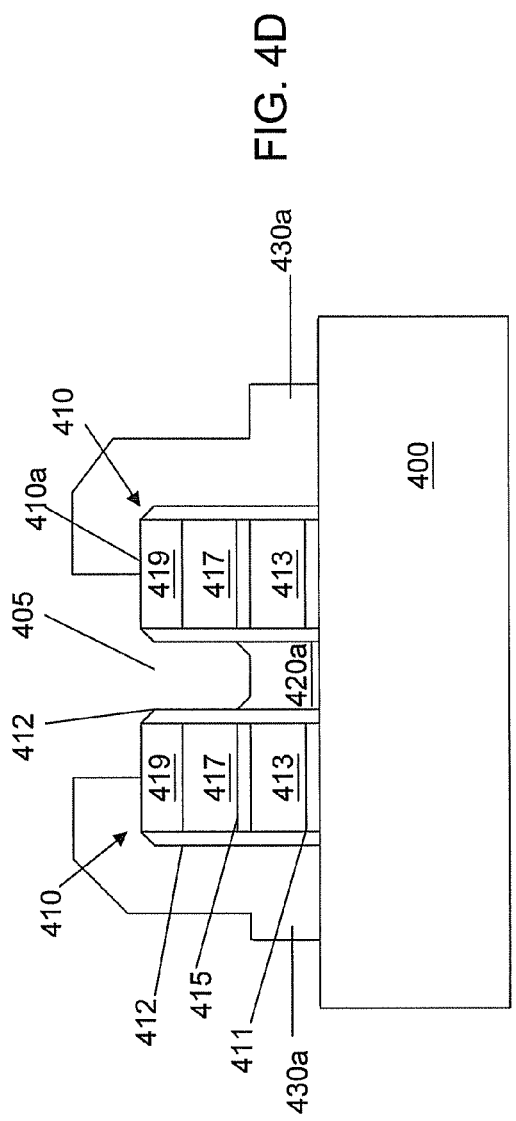

Referring to FIG. 4D, a portion of the conductive layer 430 is removed by an etch process to expose the top surface of the sacrificial layer 420a. The remaining conductive layer 430a is the select gate of the flash transistor. In some embodiments, the etch process has a desired etch selectivity for the conductive layer 430 to the top surface 410a of the flash transistor gate 410, e.g., the cap layer 419, so that the etch process does not substantially damage the flash transistor gate 410, e.g., the coupling gate 417. The photoresist layer 435 is then removed by a photoresist removal process.

Figure 4E:
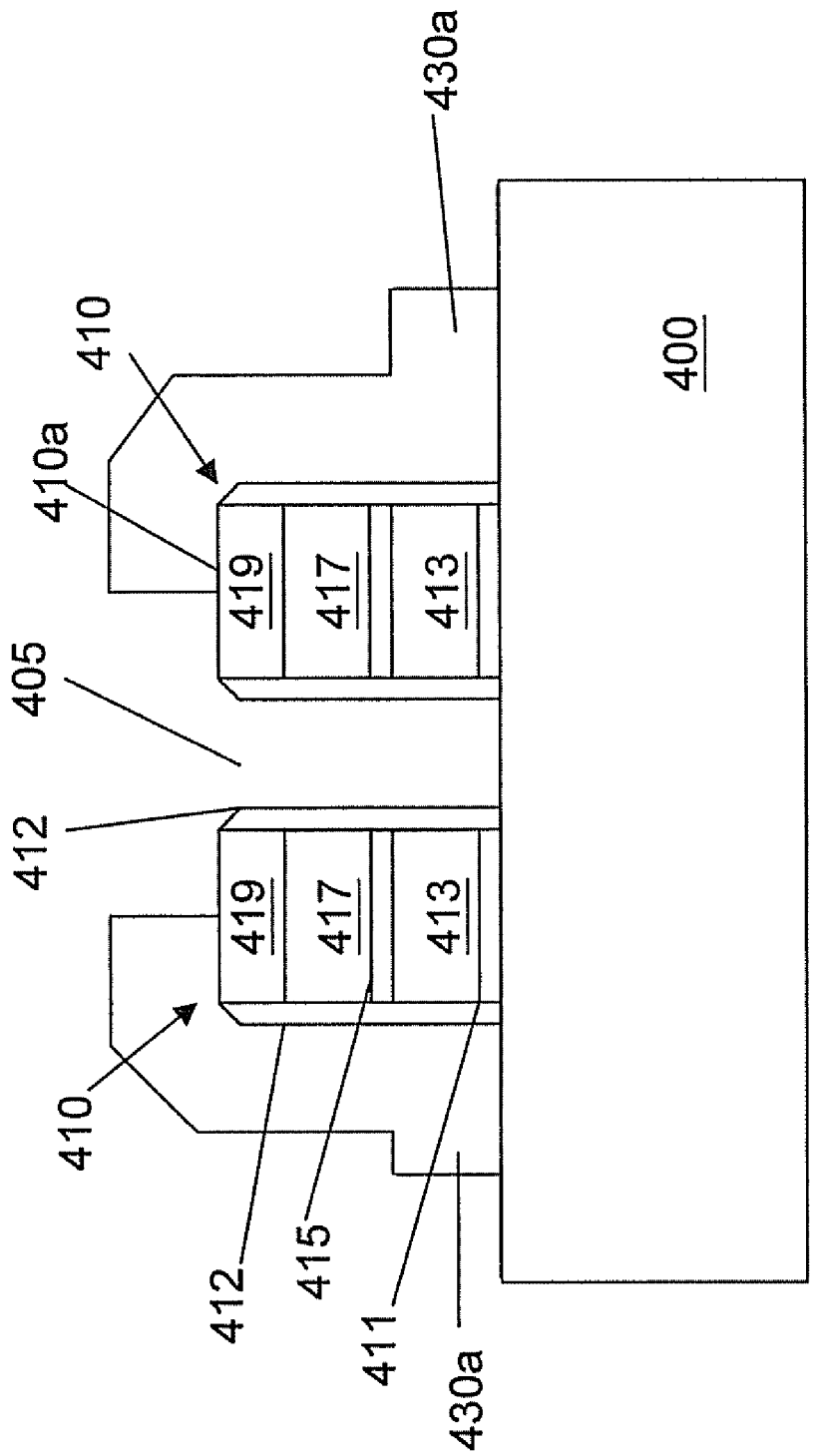

Referring to FIG. 4E, the sacrificial layer 420a within the gap 405 between the flash transistor gates 410 is removed by an oxygen-containing plasma process. In some embodiments, the sacrificial layer 420a can be removed by an oxygen-containing plasma process that has a desired etch rate, if the plasma process does not substantially damage the exposed surface of the substrate 400, the conductive layer 430a and/or the flash transistor gates 410 as shown in FIG. 4E. In some embodiments, in which the sacrificial layer 420a includes amorphous carbon, the plasma process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr. In other embodiments, the photoresist layer 435 and sacrificial layer 420a are removed by the same etch process. For these embodiments, at least one removal process, either the removal process of the sacrificial layer 420a or the removal process of the photoresist layer 435, can be omitted.

In a process without the sacrificial layer 420a within the gap 405, a conductive layer is completely filled within the gap 405. The conductive layer in the gap 405 from the top surface of the substrate 400 to the top surface of the conductive layer must be removed. Due to the large height of the conductive layer within the gap 405, an over-etch, such as a polysilicon over-etch, is used to remove the conductive layer within the gap 405. The over-etch may damage the exposed substrate or transistor gates. Compared with the above-described process, when a sacrificial layer 420a is used, the height of the conductive layer 430 within the gap 405 as shown in FIG. 4C is reduced due to the remaining sacrificial layer 420a. The conductive layer 430 within the gap 405 can be properly and completely removed without an undesired over-etch. After the removal of the conductive layer 430 within the gap 405, the sacrificial layer 420a is exposed. The sacrificial layer 420 can be properly removed by the etch process, such as the oxygen-containing plasma process. Accordingly, the window to form the conductive layer 430a, i.e., the select gate of the flash transistor, is increased.

The dimensions of the dielectric layers, material layer and conductive layers set forth above are illustrated for examples using 90-nm or 65-nm semiconductor technology. The present invention is not limited thereto. One of ordinary skill in the art can understand that these physical characteristics vary with applied semiconductor process and readily form a desired flash transistor.

FIGS. 5A-5D are schematic cross-sectional views illustrating a process for formation of a source/drain region of a transistor.

Referring to FIG. 5A, a transistor gate 510 is formed over a substrate 500. The transistor gate 510 includes a conductive layer 511 and a gate insulator 513. A dielectric layer 515 is formed over the transistor gate 510 and the substrate 500. A substantially conformal material layer 520 is formed over the dielectric layer 515. The substrate 500 may be similar to the substrate 200 as set forth above. The conductive layer 511 can be, for example, a polysilicon layer, amorphous silicon layer, silicon/silicon germanium (SiGe), a metal-containing layer, such as a TiN layer, or other conductive layer that can be a gate of a transistor. The conductive layer 511 can be formed, for example, by a CVD process, PVD process, atomic layer deposition (ALD) process or other process that can form a gate of a transistor. In some embodiments, the process is applied in 90-nm or 65-nm semiconductor technology. In some embodiments, the conductive layer 511 has a thickness of about 1,200 Å to about 1,700 Å. The gate insulator 513 can be, for example, an oxide layer, nitride layer, oxynitride layer or other material layer that can insulate the conductive layer 511 from the substrate 500. The gate insulator 513 can be formed, for example, by a CVD process, PVD process, atomic layer deposition (ALD) process or other process that can form a gate insulator of a transistor. In some embodiments of 90-nm or 65-nm semiconductor technology, the conductive layer 511, such as a polysilicon layer, has a thickness of about 1,200 Å to about 1,700 Å; and the gate insulator 513, such as an oxide layer, has a thickness of about 20 Å to about 40 Å.

The dielectric layer 515 can be, for example, an oxide layer, nitride layer, oxynitride layer or other dielectric layer that has an etch selectivity different from that of the material layer 520 and that of the substrate 500. The dielectric layer 515 can be formed, for example, by a CVD process, PVD process, atomic layer deposition (ALD) process or other process that can form the dielectric layer 515. In some embodiments of 90-nm or 65-nm semiconductor technology, the dielectric layer 515, such as a nitride layer, has a thickness of about 250 Å to about 350 Å. The material layer 520 is similar to the material layer 230 as set forth above.

Referring to FIG. 5B, a portion of the material layer 520 is removed by an etch process to form material spacers 520a on sidewalls of the transistor gate 510 and to expose a top region of the dielectric layer 515 and the other regions not covered by the material spacers 520a. In some embodiments, the material spacers 520 are not substantially laterally etched by the etch process to obtain a desired profile thereof. The desired profile of the spacers 520a is used to define source/drain regions 530 at desired locations as shown in FIG. 5D. The desired locations of the source/drain regions 530 can prevent or reduce short-channel effect and/or punch-through effect between the source/drain regions 530.

In some embodiments, the etch process has a desired etch selectivity for the material layer 520, such as an amorphous carbon, to the dielectric layer 515, such as a nitride layer. In some embodiments, the etch selectivity is of about 80:1 to about 120:1. In order to achieve the desired selectivity and/or profile, the etch process may include a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr. Thus, the etch process does not substantially damage the dielectric layer 515 and the substrate 500 can be effectively protected by the dielectric layer 515. In still other embodiments, the etch process may include: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

Referring to FIG. 5C, a portion of the dielectric layer 515 and a portion of the material spacers 520a are removed and the source/drain regions 530 are formed within the substrate 500 adjacent to the transistor gate 510. The remaining dielectric layer 515a has an L-shape structure. The portion of the dielectric layer 515 and portion of the material spacers 520a can be removed by a dry etch process that has substantially equal, or higher, etch selectivity for the dielectric layer 515 to the material spacers 520a. In some embodiments, the process to remove the dielectric layer 515 does not substantially damage the substrate 500 so as to cause undesired current leakage at the source/drain regions 530. The source/drain regions 530 can be formed by an ion implantation process. For ion implantation, the material spacers 520a are used as a hard mask to prevent ions implanted substantially into the substrate 500 under the transistor gate 510 and the material spacers 520a. The source/drain regions 530 can be N or P type source/drain regions.

Referring to FIG. 5D, the material spacers 520a are removed by an oxygen-containing plasma process. In some embodiments, the material spacers 520a can be removed by an ash process that has a desired etch rate for the material spacers 520a, if the ash process does not substantially damage the substrate 500, the conductive layers 511 and/or the source/drain regions 530. In some embodiments in which the material spacers 520a include amorphous carbon spacers, the plasma process includes: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr. Accordingly, the plasma process will not substantially damage the substrate 500, the conductive layers 511 and/or the source/drain regions 530.

In some embodiments, lightly-doped drain (LDD) regions (not shown) are formed within the substrate 500 under the L-shaped dielectric layers 515. The LDD regions can be formed by an ion implantation process, for example.

The dimensions of the dielectric layers, material layer and conductive layer set forth above are illustrated for examples using 90-nm or 65-nm semiconductor technology. The present invention is not limited thereto. One of ordinary skill in the art can understand that these physical characteristics vary with applied semiconductor process and readily form a desired source/drain structure.

FIGS. 6A-6E are schematic cross-sectional views illustrating a process for formation of air gaps over a pixel.

Referring to FIG. 6A, a pixel 610 is formed within a dielectric layer 615 over a substrate 600. The substrate 600 may be similar to the substrate 200. In some embodiments, the substrate 600 include at least one transistor, device or circuit (not shown) coupled to the pixel 610. The pixel 610 can be, for example, a CMOS image sensor (CIS), charge coupled device (CCD), liquid crystal display (LCD) pixel, plasma display pixel, electro luminescence (EL) lamp display pixel, or light emitting diode (LED) pixel (collectively referred to as, pixel 610). The dielectric layer 615 can be, for example, an oxide layer, nitride layer, oxynitride layer or other dielectric layer that can isolate two pixels 610. The dielectric layer 615 can be formed, for example, by a CVD process, PVD process, atomic layer deposition (ALD) process or other process that can form the dielectric layer 615.

A dielectric layer 620 having an opening 625 is formed over the pixel 610 and the dielectric layer 615. The opening 625 exposes a substantial top surface of the pixel 610. The dielectric layer 615 can be, for example, an oxide layer, nitride layer, oxynitride layer, low-k dielectric layer or other dielectric layer. In some embodiments for 0.18-μm semiconductor technology, the opening 625 has a width of about 2.5 μm to about 3.5 μm; and the dielectric layer 615, such as an oxide layer, has a thickness from 2.8 μm to about 3.8 μm.

A substantially conformal material layer 630 is formed over the dielectric layer 620 and the exposed top surface of the pixel 610. The material layer 630 is similar to the material layer 230 as set forth above. In some embodiments for 0.18-μm semiconductor technology, the material layer 630, such as an amorphous carbon layer, has a thickness of about 1,000 Å to about 1,500 Å.

Figure 6E:
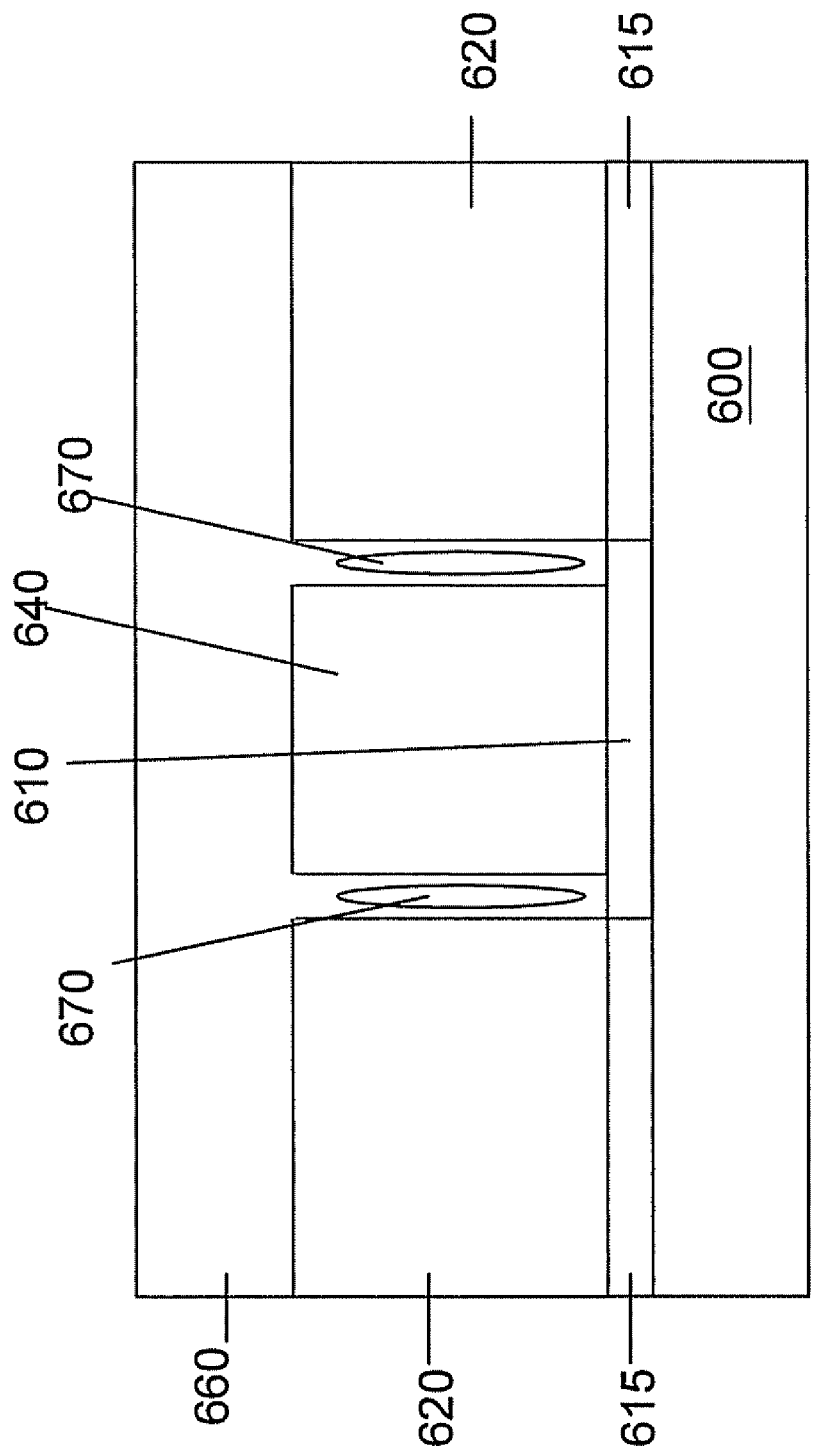

Referring to FIG. 6B, a portion of the material layer 630 is removed by an etch process to form material spacers 630a on sidewalls of the dielectric layer 615. The etch process also removes a portion of the material layer 630, which covers the pixel 610 to substantially expose the top surface of the pixel 610. In some embodiments, the material spacers 630a are not substantially laterally etched by the etch process so as to obtain a desired profile thereof. The desired profile of the material layer 630 is then removed to obtain a desired width of gaps 650 as shown in FIG. 6D. The width of the gaps 650 is used to form desired air gaps 670 as shown in FIG. 6E. The air gaps 670 can effectively reduce or prevent light scattering resulting from lights emitted from neighboring pixels 610.

In order to obtain the desired profile of the material spacers 630a, the etch process includes a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr. In still other embodiments, the etch process may include: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

Referring to FIG. 6C, a dielectric layer 640 is substantially filled within the opening 625 shown in FIG. 6B. The dielectric layer 640 can be, for example, an oxide layer, nitride layer, oxynitride layer, low-k dielectric layer or other dielectric layer. The dielectric layer 640 can be formed, for example, by a CVD process, PVD process, atomic layer deposition (ALD) process or other process that can form the dielectric layer 640. A portion (not shown) of the dielectric layer 640 over the top surface of the dielectric layer 620 is removed, for example, by an etch-back process or CMP process. In some embodiments, the dielectric layer 640 may be slightly recessed within the opening 625 or extrude over the top surface of the dielectric layer 620, if the recess or the extrusion of the dielectric layer 640 does not adversely affect of illumination performance of the pixel 610 and/or the subsequent process to seal the gaps 650 shown in FIG. 6E.

Referring to FIG. 6D, the material spacers 630a are substantially removed by an oxygen-containing plasma process to form the gaps 650 between the dielectric layers 620 and 640. As discussed above, the width of the gap 650 is substantially equal to the width of the material spacer 630a, i.e., about 1,000 Å to about 1,500 Å. In some embodiments, the material spacers 630a can be removed by a plasma process that has a desired etch rate for the material spacers 630a, if the plasma process does not substantially damage the dielectric layers 620 and 640. In some embodiments in which the material spacers 630a include amorphous carbon, the ash process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

Though the gap 650 has an aspect ratio (depth/width) of about 18.7 to about 38, the oxygen-containing plasma process can substantially remove the material spacers 630a within the gaps 650 without substantially damaging the dielectric layers 620 and 630.

In some embodiments, the material spacers 630a between the dielectric layers 620 and 640 are substantially completely removed to expose portions of the top surface of the pixel 610 and/or the dielectric layer 615 within the gaps 650. In other embodiments, a portion of the material spacers 630a remains within the gap 650 as long as a desired air gap 670 as shown in FIG. 6E can be obtained.

Referring to FIG. 6E, a dielectric layer 660 is formed over the dielectric layers 620 and 640 to seal the gaps 650 (shown in FIG. 6D) to form the air gaps 670. The dielectric layer 660 can be, for example, an oxide layer, nitride layer, oxynitride layer, low-k dielectric layer or other dielectric layer. The dielectric layer 660 has poor deposition conformity so that the dielectric layer 660 can be formed thicker at the top and bottom regions of the gap 650 and thinner at the central region of the gaps 650. In some embodiment for 0.18-μm semiconductor technology, the dielectric layer 660, such as a plasma enhanced (PE) oxide, has a thickness of about 2,000 Å to about 3,000 Å from the top surface of the dielectric layer 620 to the top surface of the dielectric layer 660. In some embodiments, the dielectric layer 660 is formed by a plasma enhanced chemical vapor deposition (PECVD) process to seal top regions of the gaps 650 to form the air gaps 670. With the air gaps 670, the scattering effect resulting from lights emitted from neighboring pixels 610 can be substantially reduced or prevented.

The dimensions of the dielectric layers and material layer set forth above are illustrated by embodiments using 0.18-μm semiconductor technology. The present invention is not limited thereto. One of ordinary skill in the art can understand that these physical characteristics vary with applied semiconductor process and readily form a desired air gap structure over a pixel.

FIGS. 7A-7E are schematic cross-sectional views illustrating a process for formation of air gaps next to a conductive layer.

Figure 7A:
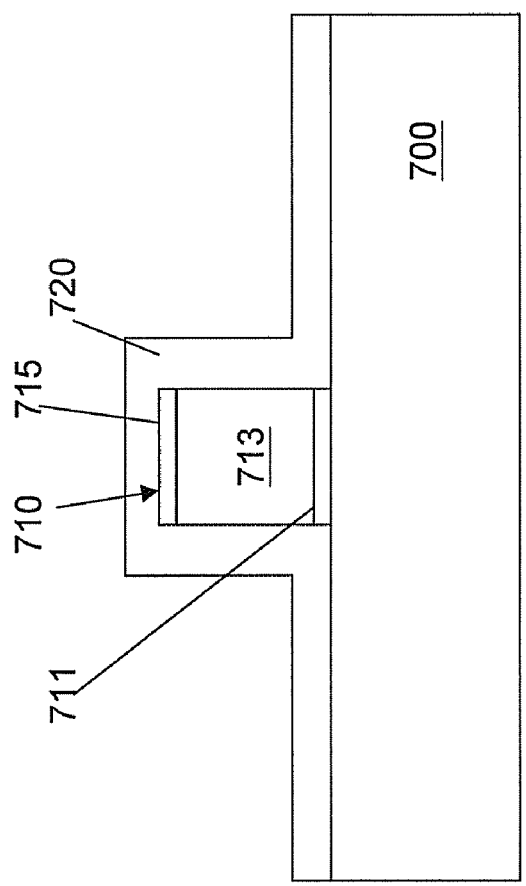

Referring to FIG. 7A, a conductive line 710 is formed over a substrate 700. The substrate 700 may be similar to the substrate 200. In some embodiments, the substrate 700 includes transistors, devices or circuits (not shown) thereon coupled to the conductive line 710. In some embodiments, the conductive line 710 comprises a barrier layer 711, a conductive layer 713 and a cap layer 715. The barrier layer 711 and cap layer 715 can be, for example, a titanium (Ti) layer, titanium nitride (TiN) layer, Ti/TiN layer or a material layer that can protect the conductive layer 713 or enhance adhesion between the conductive line 710 and a dielectric layer (not shown) over the substrate 700 or a dielectric layer 750 over the conductive line 710 as shown in FIG. 7E. The barrier layer 711 and cap layer 715 can be formed, for example, by a CVD process, PVD process, chemical plating process or other process that can form the barrier layer 711 and the cap layer 715. The conductive layer 713 can be, for example, an aluminum/copper layer, aluminum layer, copper layer or other metal-containing layer. The conductive layer 713 can be formed, for example, by a CVD process, PVD process, chemical plating process or other process that can form the metal-containing layer. In some embodiments, each of the barrier layers 711, such a TiN layer, and cap layer 715, such as a TiN layer, has a thickness of about 200 Å to about 500 Å; and the conductive layer 713, such as an aluminum copper layer, has a thickness of about 4,000 Å to about 10,000 Å. The thicknesses of the layers vary with layer level of the conductive line 710. For example, if the conductive line 710 is formed within an interlayer dielectric (ILD) layer, the conductive line 710 has a small thickness. If the conductive line 710 is formed as a top metal layer over the substrate, the conductive line 710 has a large thickness.

A substantially conformal material layer 720 is formed over the conductive line 710 and the substrate 700. The material layer 720 is similar to the material layer 230 as set forth above. In some embodiments, the material layer 720, such as an amorphous carbon layer, has a thickness of about 250 Å to about 450 Å.

Figure 7B:
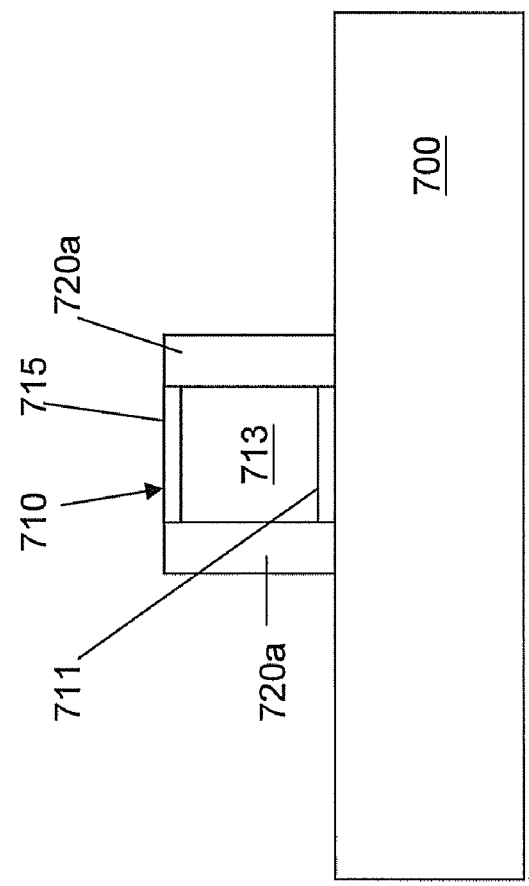

Referring to FIG. 7B, a portion of the material layer 720 is removed by an etch process to form material spacers 720a on sidewalls of the conductive line 710 and to expose a top region of the conductive line 710, such as the top surface of the cap layer 715, and the other regions of the substrate 700 not covered by the material spacers 720a. In some embodiments, the material spacers 720a are not substantially laterally etched by the etch process so as to form a desired profile thereof. The material spacers 720a is then removed to obtain a desired width of gaps 740 as shown in FIG. 7D. The width of the gaps 740 is used to form desired air gaps 760 as shown in FIG. 7E. The air gaps 760 can efficiently reduce the dielectric constant of the dielectric material between two neighboring conductive lines 710. In some embodiments, the etch process has an etch selectivity for the material layer 720 to a dielectric layer (not shown) over the substrate 700 and under the conductive line 710. Thus, the etch process does not substantially damage the dielectric layer over the substrate 700 and the substrate 500 can be effectively protected by the dielectric layer.

In order to obtain the desired profile of the material spacers 720a, the etch process may include a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr. In still other embodiments, the etch process may include: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

Figure 7C:
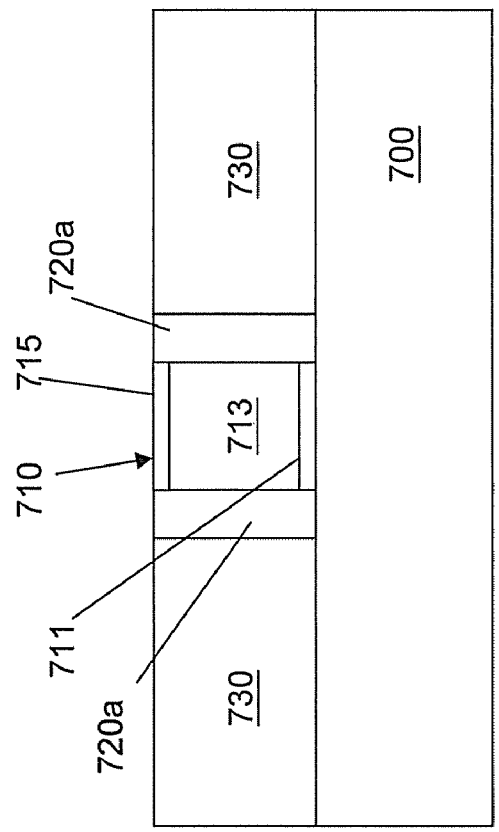
Figure 7D:
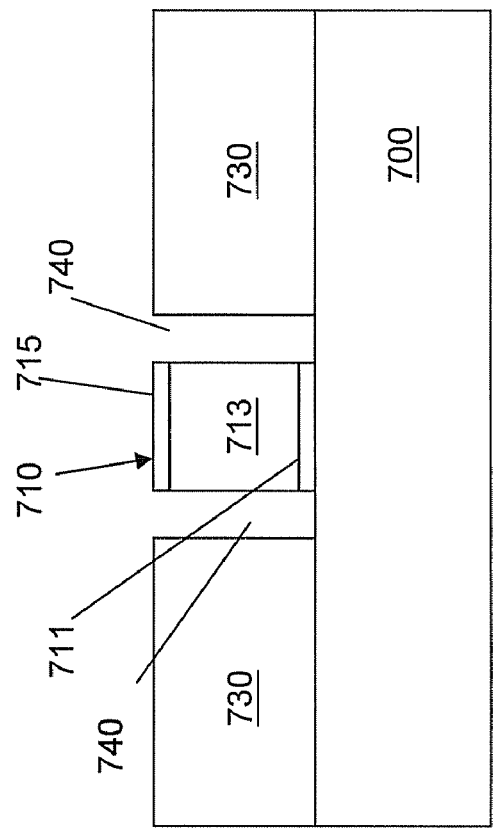

Referring to FIG. 7C, a dielectric layer 730 is formed adjacent to the sidewalls of the material spacers 730 to expose a top surface of the conductive line 710 and top surfaces of the material spacers 720a. The dielectric layer 730 can be, for example, an oxide layer, nitride layer, oxynitride layer, low-k dielectric layer or other dielectric layer that can isolate neighboring conductive lines 710. The dielectric layer 730 can be formed, for example, by a CVD process, PVD process, atomic layer deposition (ALD) process or other process that can form a dielectric layer. In some embodiments, the dielectric 730, such as a low-k dielectric layer, has a thickness of about 4,000 Å to about 1 μm.

Referring to FIG. 7D, the material spacers 720a are substantially removed by an oxygen-containing plasma process to form the gaps 740 between the dielectric layer 730 and the conductive line 710. In some embodiments, the material spacers 720a can be removed by a plasma process that has a desired etch rate for the material spacers 720a, if the plasma process does not substantially damage the dielectric layer 730 and/or the conductive line 710. In some embodiments in which the material spacers 720a include amorphous carbon, the plasma process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

Though the gap 740 has an aspect ratio (depth/width) of about 9 to about 40, the oxygen-containing plasma process can substantially remove the material spacers 720a within the gaps 740 without substantially damaging the dielectric layer 730 and/or the conductive line 710.

In some embodiments, the material spacers 720a between the dielectric layer 730 and/or the conductive line 710 are substantially completely removed to expose portions of the top surface of the substrate 700 within the gaps 740. In other embodiments, a portion of the material spacer 720a remains within the gap 740 as long as a desired air gap 760 as shown in FIG. 7E can be obtained.

Referring to FIG. 7E, a dielectric layer 750 is formed over the dielectric layer 730 and the conductive line 710 to seal the gaps 740 (shown in FIG. 7D) to form the air gaps 760. The dielectric layer 750 can be, for example, an oxide layer, nitride layer, oxynitride layer, low-k dielectric layer or other dielectric layer. The dielectric layer 750 has poor deposition conformity so that the dielectric layer 750 can be formed thicker at the top and bottom regions of the gap 740 and thinner at the central region of the gaps 740. In some embodiment, the dielectric layer 750, such as a plasma enhanced (PE) oxide, has a thickness of about 2,000 Å to about 3,000 Å from the top surface of the dielectric layer 730 to the top surface of the dielectric layer 750. In some embodiments, the dielectric layer 750 is formed by a plasma enhanced chemical vapor deposition (PECVD) process to seal top regions of the gaps 740 to form the air gaps 760. With the air gaps 760, the dielectric constant between neighboring conductive lines 710 is reduced. Thus, resistance-capacitance (RC) time delay resulting from parasitic capacitance between two neighboring conductive lines 710 can be reduced.

FIGS. 8A-8F are schematic cross-sectional views illustrating a process for formation of a self-aligned contact plug.

Referring to FIG. 8A, a pair of transistor gates 810 are formed over a substrate 800. In some embodiments, the transistor gate 810 includes, for example, a conductive layer 811, a gate insulator 813 and spacers 815. The substrate 800 can be similar to the substrate 200 as set forth above. The conductive layer 811 can be, for example, a polysilicon layer, amorphous silicon layer, silicon/silicon germanium (SiGe), a metal-containing layer, such as a TiN layer, or other conductive layer that can be a gate of a transistor. The conductive layer 811 can be formed, for example, by a CVD process, PVD process, atomic layer deposition (ALD) process or other process that can form a gate of a transistor. The gate insulator 813 can be, for example, an oxide layer, nitride layer, oxynitride layer or other material layer that can insulate the conductive layer 811 from the substrate 800. The gate insulator 813 can be formed, for example, by a CVD process, PVD process, atomic layer deposition (ALD) process or other process that can form a gate insulator of a transistor. The spacers 815 can be, for example, an oxide layer, nitride layer, oxynitride layer or other material layer that can protect the conductive layer 811 from damages caused by subsequent process. The spacers 815 can be formed, for example, by a CVD process, PVD process, atomic layer deposition (ALD) process or other process that can form a gate insulator of a transistor. In some embodiments using 90-nm or 65-nm semiconductor technology, the conductive layer 811, such as a polysilicon layer, has a thickness of about 1,200 Å to about 1,700 Å; the gate insulator 813, such as an oxide layer, has a thickness of about 20 Å to about 40 Å; a thickest portion of the spacer 815, such as nitride spacers, has a thickness of about 400 Å to about 700 Å; and a distance "d" between the sidewalls of the conductive layers 811 is of about 0.2 μm to about 0.3 μm.

A material layer 820 is formed over the transistor gates 810 and the substrate 800. The material layer 820 is similar to the material layer 340 as described above. Detailed descriptions are not repeated. In some embodiments of 90-nm or 65-nm semiconductor technology, the material layer 820 has a thickness from the top surface of the substrate 800 to the top surface of the material layer 820 of about 3,800 Å to about 4,300 Å.

A dielectric layer 823 is formed over the material layer 820. The dielectric layer 823 can be, for example, an oxide layer, nitride layer, oxynitride layer or other material layer that can be a hard mask for a subsequent etch process to form an opening within the material layer as shown in FIG. 8B. The dielectric layer 823 can be formed, for example, by a CVD process, PVD process, atomic layer deposition (ALD) process or other process that can form a dielectric hard mask. In some embodiments of 90-nm or 65-nm semiconductor technology, the dielectric layer 823, such as an oxynitride layer, has a thickness of about 600 Å to about 1,000 Å. A photoresist layer 825 including an opening 827 is formed over the dielectric layer 823. The photoresist layer 825 can be formed by a photolithographic process. The opening 827 has a width of about 0.13 μm to about 0.15 μm. The opening 827 is defined at a location under which a contact plug 840a as shown in FIG. 8D is to be formed.

Referring to FIG. 8B, a portion of the dielectric layer 823 and a portion of the material layer 820 are removed to form an opening 830 within the material layer 820a and between the transistor gates 810 to expose a partial top surface of the substrate 800.

In some embodiments, the etch process has a desired selectivity for the material layer 820a to the dielectric layers 823a so that the etch process does not substantially damage the exposed top surface of the substrate 800 within the opening 830. In some embodiments, the remaining material 820a are not substantially laterally etched by the etch process, so that a desired profile of the opening 830 is achieved. In some embodiments, in order to obtain the desired profile of the opening 830, the etch process includes a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr. In other embodiments in which the profile of the opening 830 is not a concern, the etch process includes a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr. After the formation of the opening 830, the photoresist layer 825 is removed. The removal process of the photoresist layer 825 can be any photoresist removal process.

In some embodiments, the spacers 815, such as nitride spacers, serve as a hard mask when the portion of the material layer 820 is removed to form the opening 830. As set forth above, the etch process has a desired etch selectivity, such as about 80:1 to about 120:1, for the material layer 820a to the spacer 815. The spacers 815 are not substantially damaged by the etch process and thus are able to protect the conductive layer 811 from being damaged.

Figure 8C:
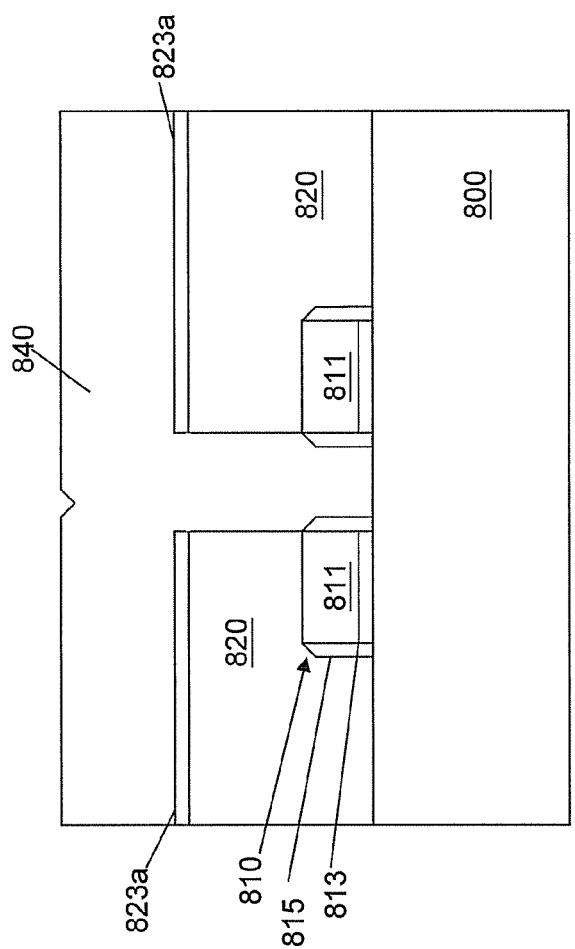
Figure 8D:
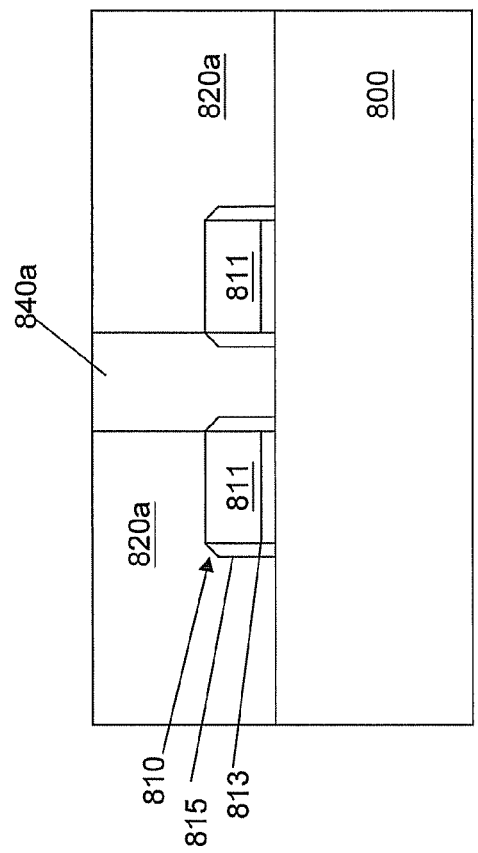

Referring to FIG. 8C, a conductive layer 840 is formed within the opening 830, covering the dielectric layer 823a. The conductive layer 840 can be, for example, an aluminum/copper layer, aluminum layer, copper layer, tungsten layer or other conductive material layer. The conductive layer 840 can be formed, for example, by a CVD process, PVD process, chemical plating process, chemical electroless plating or other process that can form the conductive layer 840. In some embodiments, prior to the formation of the conductive layer 840, a barrier layer, such as TiN (not shown), is formed within the opening 830 and over the dielectric layer 823a.

Referring to FIG. 8D, an etch-back process or CMP process removes the dielectric layer 823a and a portion of the conductive layer 840 over the top surface of the material layer 820a to form the conductive layer 840a, i.e., a via/conduct plug, within the opening 830. In some embodiments which include the TiN barrier layer (not shown) as described above, the etch-back or CMP process also removes a portion of the barrier layer over the top surface of the material layer 820a.

Figure 8E:
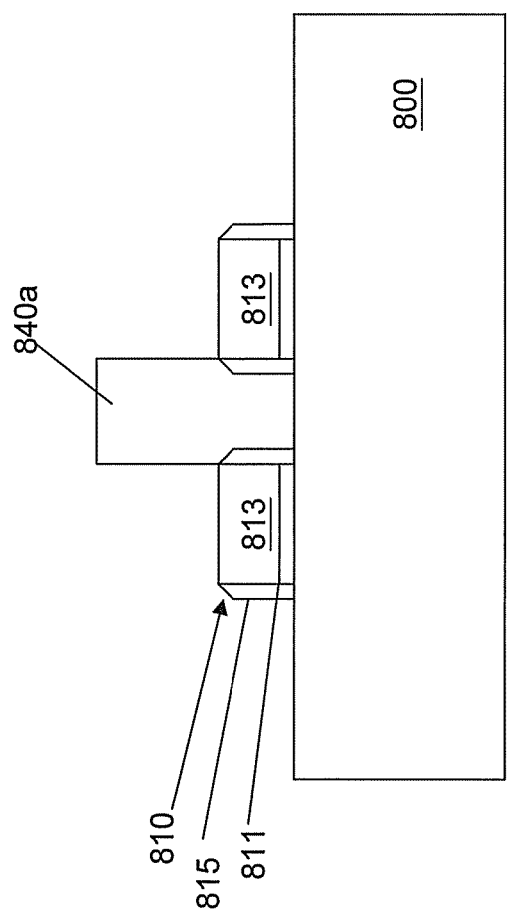

Referring to FIG. 8E, the remaining material layer 820a is removed by an oxygen-containing plasma process to expose a top region of the conductive layer 840a over a top surface of the transistor gate 810. In some embodiments, the material layer 820a can be removed by a plasma process that has a desired etch rate for the material layer 820a, if the plasma process does not substantially damage the substrate 800, the conductive layer 840a and/or the transistor gates 810. In some embodiments in which the material layer 820 include amorphous carbon, the ash process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr. Because the plasma process does not substantially damage the substrate 800, the conductive layer 840a and/or the transistor gates 810, a desired profile of the conductive plug 840a can be obtained as shown in FIG. 8E.

Figure 8F:
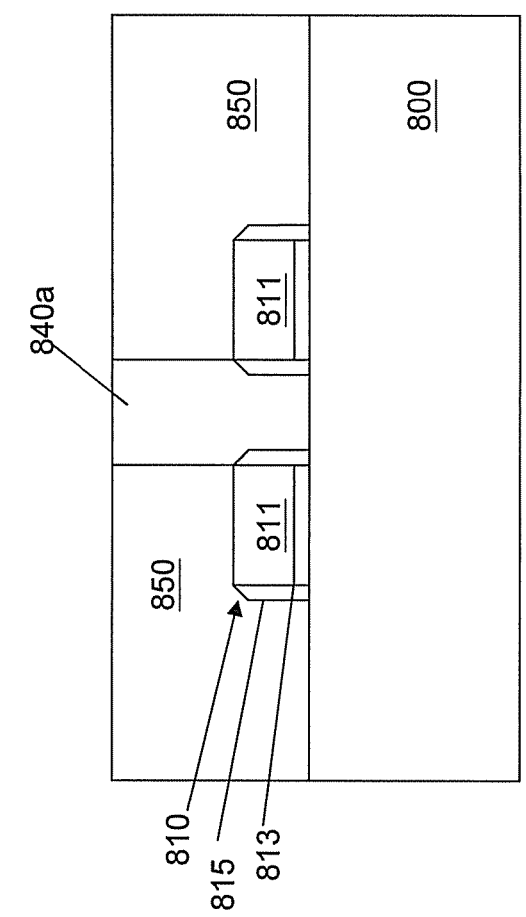

Referring to FIG. 8F, a dielectric layer 850 is formed, covering the transistor gates 810 and the conductive layer 840a to expose a top surface of the conductive layer 840a. The dielectric layer 850 can be, for example, an oxide layer, nitride layer, oxynitride layer, low-k dielectric layer or other material layer that can insulate the transistor gates 810 from other transistor gate or circuit (not shown). The dielectric layer 850 can be formed, for example, by a CVD process, PVD process, atomic layer deposition (ALD) process, spin-on process or other process that can form a dielectric layer. A portion of the dielectric layer 850 over the top surface of the conductive layer 840*a* (not shown) is then removed by an etch-back process or CMP process. In some embodiments of 90-nm or 65-nm semiconductor technology, the dielectric layer 850 has a thickness of about 3,800 Å to about 4,300 Å from the top surface of the substrate 800 to the top surface of the dielectric layer 850. Compared with a dielectric material, such as oxide or nitride, the material layer 820 has a low thermal stability when the material layer 820 is subjected to a subsequent thermal process, such as a thermal curing process. The material layer 820 is thus removed and the dielectric layer 850 is formed to cover the transistor gates 810 so that subsequent thermal processes can be properly performed for the substrate 800.

The dimensions of the dielectric layers, material layer and gate transistor set forth above are illustrated by 90-nm or 65-nm semiconductor technology. The present invention is not limited thereto. One of ordinary skill in the art can understand that these physical characteristics vary with applied semiconductor process and readily form a desired via/contact plug.

FIGS. 9A-9E are schematic cross-sectional views illustrating a process for formation of a via/contact plug or a conductive line.

Figure 9E:
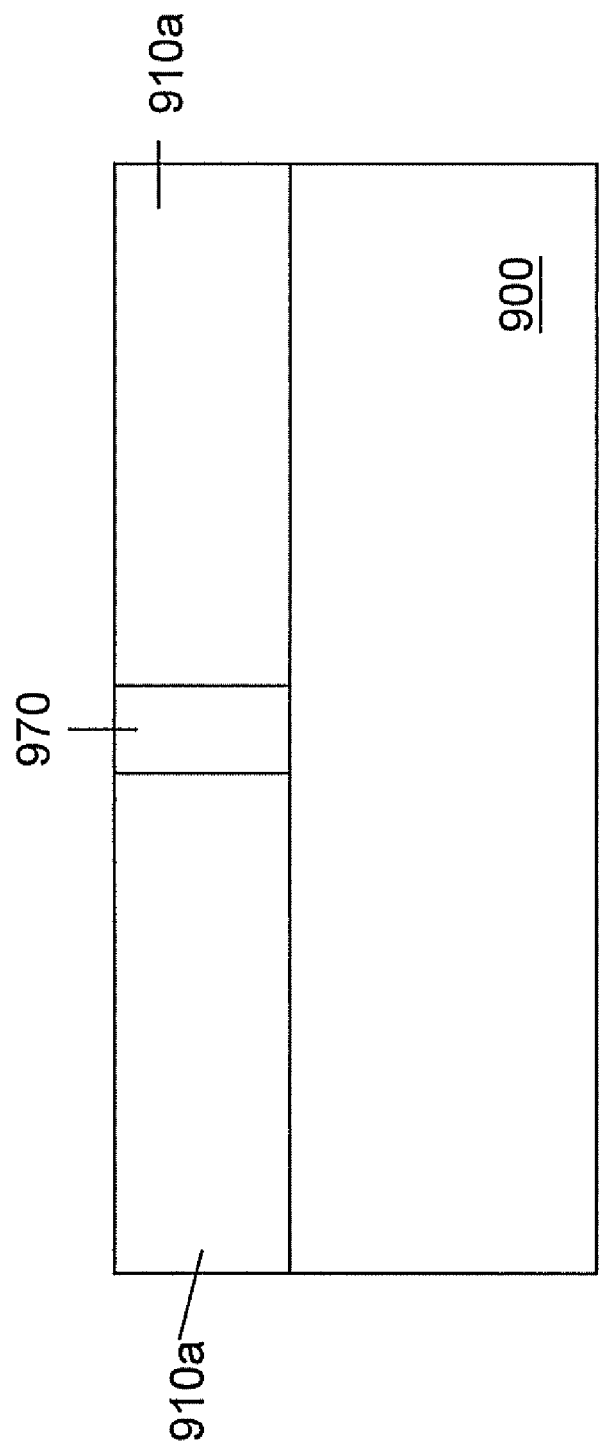

Referring to FIG. 9A, a dielectric layer 910 is formed over a substrate 900. The substrate 900 is similar to the substrate 200. Detailed descriptions are not repeated. In some embodiments, the substrate 900 includes, for example, at least one transistor, device or circuit (not shown) thereon coupled to a conductive layer 970 (shown in FIG. 9E). The dielectric layer 910 can be, for example, an oxide layer, nitride layer, oxynitride layer, low-k dielectric layer or other material layer that can insulate the conductive layer 970 (shown in FIG. 9E) from other conductive layer (not shown). The dielectric layer 910 can be formed, for example, by a CVD process, PVD process, atomic layer deposition (ALD) process, spin-on process or other process that can form a dielectric layer. In some embodiments, the dielectric layer 910, such as an oxide layer, has a thickness of about 3,000 Å to about 1.5 μm.

A material layer 920 is formed over the dielectric layer 910. The material layer 920 is similar to the material layer 340 described above. Detailed descriptions are not repeated. In some embodiments, the material layer 920 has a thickness of about 2,500 Å to about 8,000 Å.

A dielectric layer 930 is formed over the material layer 920. The dielectric layer 930 can be, for example, an oxide layer, nitride layer, oxynitride layer or other material layer that can serve as an etch stop layer. The dielectric layer 920 can be formed, for example, by a CVD process, PVD process, atomic layer deposition (ALD) process, spin-on process or other process that can form a dielectric layer. In some embodiments, the dielectric layer 930 has a thickness of about 600 Å to about 1,000 Å.

The photoresist layer 935 including an opening 937 therein is formed over the dielectric layer 930. The photoresist layer 935 including the opening 937 therein can be formed by a photolithographic process.

Referring to FIG. 9B, a portion of the dielectric layer 930 and a portion of the material layer 920 are removed to form an opening 940 within the remaining material layer 920*a* to expose a portion of the top surface of the dielectric layer 910. An etch process having a desired etch selectivity for the dielectric layer 930 to the material layer 920 removes the portion of the dielectric layer 930 defined by the opening 937 (shown in FIG. 9A). The photoresist layer 935 is then removed by a photoresist removal process, and the remaining dielectric layer 930*a* is used as a hard mask to protect the material layer 920*a* from being damaged by the photoresist removal process. The dielectric layer 930*a* is used as a hard mask layer for removal of the portion of the material layer 920 by an etch process. In other embodiments, the photoresist layer 935 is removed while the material layer 920 is partially removed by a hydrogen-containing process. For these embodiments, the opening 940 is formed within the material layer 920*a* while the photoresist layer 935 is substantially removed.

The sidewalls of the material layer 920*a* are not substantially laterally etched by the etch process to obtain a desired profile of the opening 940. A substantially conformal material layer 950 is formed over the opening 940 and the dielectric layer 930*a*. The material layer 950 is similar to the material layer 230 as described above. In some embodiments, the material layer 950 has a thickness of about 200 Å to about 400 Å. In order to obtain the desired profile of the opening 940, the etch process includes a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr. In other embodiments in which the profile of the opening 940 is not a concern, the etch process includes a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

Referring to FIG. 9C, a portion of the material layer 950 is removed by an etch process to expose a top surface of the dielectric layer 930*a* and a portion of the top surface of the dielectric layer 910 and to form material spacers 950*a* on sidewalls of the material layer 920*a*. In some embodiments, the material spacers 950 are not substantially laterally etched by the etch process so as to obtain a desired profile thereof. The material spacers 950*a* is achieved so that an opening 960 (shown in FIG. 9D) can be formed by a subsequent etch process. With the desired profile of the material spacers 950*a*, a via/contact hole or a trench of a conductive line with a small width, i.e., the width of the opening 960 (shown in FIG. 9D) is achieved. In order to achieve the desired profile of the material spacers 905*a*, the ash process includes a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr. In other embodiments in which the profile of the material spacers 950*a* is not a concern, the etch process includes a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

Referring to FIG. 9D, a portion of the dielectric layer 910 is removed to form the opening 960 within the dielectric layer 910*a* by using the material spacers 950*a* as a hard mask. In some embodiments, the dielectric layer 930*a* and portions of the material spacers 950*a* over the top surface of the 920*a* are removed by an etch process. Then, the material spacers 950*a* and the material layers 920*a* are used as a hard mask for etching the dielectric layer 910 to form the opening 960. In other embodiments, the material spacers 950*a* and the dielectric layer 930*a* are used as a hard mask for etching the dielectric layer 910 to form the opening 960. For the removal of the dielectric layer 930*a*, the etch process has a desired etch selectivity for the dielectric layer 930*a* to the material spacers 950*a* so that the material spacers 950*a* are not substantially removed.

Referring to FIG. 9E, the material spacers 950*a* and the material layer 920*a* are removed by an oxygen-containing plasma process, and the conductive layer 970 is formed within the opening 960. In some embodiments, the material spacers 950*a* and the material layer 920*a* can be removed by a plasma process that has a desired etch rate for the material layer 920*a* and spacers 950*a*, if the plasma process does not substantially damage the exposed portion of the top surface of the substrate 900 and/or the dielectric layer 910*a*. In some embodiments in which the material layer 920*a* and spacers 950 include amorphous carbon, the plasma process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr. Because the plasma process does not substantially damage the exposed top surface of the substrate 900 and/or the dielectric layer 910*a* (as shown in FIG. 9E), the conductive layer 970 can be properly formed within the opening 960.

The conductive layer 970 can be, for example, an aluminum/copper layer, aluminum layer, copper layer, tungsten layer or other conductive material layer. The conductive layer 970 can be formed, for example, by a CVD process, PVD process, chemical plating process, chemical electroless plating or other process that can form the conductive layer 970.

The dimensions of the dielectric layers, material layers and openings vary with the metal level where the conductive layer 970 is formed. For example, if the conductive layer 970 is formed within an inter-layer dielectric (ILD) layer, the conductive line 910 has small physical dimensions. If the conductive layer 970 is formed as a top metal layer over the substrate, the conductive layer 970 has large physical dimensions.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method, comprising the steps of:
    (a) forming an amorphous carbon layer over a first dielectric layer formed over a substrate by a deposition process including: a flow of $C_3H_6$ between about 1,000 standard cubic centimeters per minute (sccm) and about 1,500 sccm; a flow of He between about 400 sccm and about 500 sccm; a radio-frequency (RF) power between about 800 watts and about 1,200 watts; and a pressure between about 3.5 Torr and about 4.5 Torr;
    (b) forming a second dielectric layer over the amorphous carbon layer;
    (c) forming an opening within the amorphous carbon layer and second dielectric layer by a first etch process to partially expose a top surface of the first dielectric layer;
    (d) forming a substantially conformal metal-containing layer over the second dielectric layer and within the opening;
    (e) forming a photoresist layer on an upper surface of the substantially conformal metal-containing layer and filling the opening;
    (f) removing an upper portion of the photoresist layer, the second dielectric layer, and a portion of the metal-containing layer;
    (g) removing a remaining portion of the photoresist layer within the opening;
    (h) removing the amorphous carbon layer by an oxygen-containing plasma process to expose the top surface of the first dielectric layer after the remaining portion of the photo resist layer has been removed;
    (i) forming an insulating layer over the metal-containing layer; and
    (j) forming a second metal-containing layer over the insulating layer to form a capacitor.

2. The method of claim 1, wherein the first etch process comprises: a flow of hydrogen ($H_2$) between about 80 standard cubic centimeters per minute (sccm) and about 150 sccm; a flow of nitrogen ($N_2$) between about 150 sccm and about 300 sccm; a radio-frequency (RF) power between about 800 watts and about 1,500 watts; and a pressure between about 15 mTorr and about 50 mTorr.

3. The method of claim 1, wherein the oxygen-containing plasma process comprises: a flow of oxygen ($O_2$) between about 500 standard cubic centimeters per minute (sccm) and about 2,000 sccm; a radio-frequency (RF) power between about 200 watts and 2,000 watts; and a pressure between about 20 mTorr and 200 mTorr.

4. The method of claim 1, wherein the second dielectric layer and the portion of the metal-containing layer are removed by a sequence of etching processes.

5. The method of claim 1, wherein the second dielectric layer and the portion of the metal-containing layer are removed by a chemical mechanical polishing process.

* * * * *